US009859851B2

(12) United States Patent
Bäcklund

(10) Patent No.: US 9,859,851 B2
(45) Date of Patent: Jan. 2, 2018

(54) COUPLING ASSEMBLY AND RADIOFREQUENCY AMPLIFICATION SYSTEM HAVING THE SAME

(71) Applicant: General Electric Company, Schenectady, NY (US)

(72) Inventor: Andreas Bäcklund, Uppsala (SE)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 15/368,768

(22) Filed: Dec. 5, 2016

(65) Prior Publication Data

US 2017/0111016 A1    Apr. 20, 2017

Related U.S. Application Data

(63) Continuation-in-part of application No. 14/575,993, filed on Dec. 18, 2014, now Pat. No. 9,515,616.

(51) Int. Cl.
| | |
|---|---|
| H03F 1/00 | (2006.01) |
| H03F 1/56 | (2006.01) |
| H01F 38/14 | (2006.01) |
| H01P 7/06 | (2006.01) |
| H03F 3/189 | (2006.01) |
| H03F 3/22 | (2006.01) |

(52) U.S. Cl.
CPC ............... *H03F 1/56* (2013.01); *H01F 38/14* (2013.01); *H01P 7/06* (2013.01); *H03F 3/189* (2013.01); *H03F 3/22* (2013.01); *H03F 2200/267* (2013.01); *H03F 2200/451* (2013.01)

(58) Field of Classification Search
CPC ................. H03F 1/00; H03F 3/58; H03F 3/54

USPC ............................................. 330/65, 43, 44
See application file for complete search history.

(56) References Cited

U.S. PATENT DOCUMENTS

| | | | |
|---|---|---|---|
| 2,293,152 A | 8/1942 | Litton | |
| 2,428,809 A * | 10/1947 | Parilla | F01B 3/0005 |
| | | | 91/184 |

(Continued)

FOREIGN PATENT DOCUMENTS

| | | |
|---|---|---|
| GB | 696801 A | 9/1953 |
| GB | 760323 A | 10/1956 |

OTHER PUBLICATIONS

Whitaker, Power Vacuum Tubes Handbook 2nd Edition, Chapter 5, "Applying Vacuum Tube Devices" (2000).

(Continued)

*Primary Examiner* — Henry Choe
(74) *Attorney, Agent, or Firm* — Dean D. Small; The Small Patent Law Group, LLC

(57) ABSTRACT

RF amplification system includes a power cavity and a coupling loop operably positioned within the power cavity between an inner conductor and an outer conductor. The coupling loop includes a secured segment that is coupled to the grounding deck and a movable segment that is coupled to the secured segment. The secured segment extends between the grounding deck and the movable segment. The coupling loop defines a loop region that correlates to an amount of inductive coupling between the coupling loop and magnetic field within the power cavity. The movable segment is movable relative to the secured segment while the secured segment is stationary to change a size of the loop region and thereby change the amount of inductive coupling.

20 Claims, 21 Drawing Sheets

(56) References Cited

U.S. PATENT DOCUMENTS

| | | | |
|---|---|---|---|
| 2,551,715 A | 5/1951 | Young | |
| 2,706,802 A * | 4/1955 | Shrader | H03F 3/54 |
| | | | 330/56 |
| 2,790,855 A * | 4/1957 | Meisenheimer | H03F 3/54 |
| | | | 330/56 |
| 2,837,686 A | 6/1958 | Drieschman et al. | |
| 3,133,253 A | 5/1964 | Lader | |
| 3,492,061 A * | 1/1970 | Dillon, Jr. | G02F 1/29 |
| | | | 359/298 |
| 3,536,952 A * | 10/1970 | Findley | H01J 7/24 |
| | | | 313/11 |
| 3,733,566 A * | 5/1973 | Hanft | H01P 7/04 |
| | | | 333/222 |
| 3,784,911 A | 1/1974 | Ramstrom | |
| 3,904,995 A | 9/1975 | Phillips | |
| 4,051,447 A | 9/1977 | Heckman, Jr. | |
| 5,731,269 A | 3/1998 | Clermont | |
| 6,133,786 A | 10/2000 | Symons | |
| 6,417,634 B1 | 7/2002 | Bergstrom | |
| 6,426,681 B1 | 7/2002 | Amini | |
| 6,724,261 B2 | 4/2004 | Cheo | |
| 7,339,366 B2 | 3/2008 | Li | |
| 7,982,561 B2 | 7/2011 | Mendenhall | |
| 8,106,570 B2 | 1/2012 | Norling et al. | |
| 8,153,997 B2 | 4/2012 | Norling et al. | |
| 8,169,277 B2 | 5/2012 | McIntyre et al. | |
| 8,653,762 B2 | 2/2014 | Eriksson et al. | |

OTHER PUBLICATIONS

Tube Amplification Unit (TAU) of General Electric MINITrace, Part No. 907630 (1999).

Kurkin, G.Y., "Other RF Power Sources," In Frontiers of Accelerator Technology (1999).

MINITrace Qilin: Installation Manual, Revision 13 (2014), pp. 1-16 and 217-223.

MINITrace Qilin: Service Manual, Revision 14 (2014), pp. 361-363 and 423-429.

International Search Report and Written Opinion from corresponding PCT Application PCT/US2015/053124 dated Jan. 4, 2016; 12 pages.

* cited by examiner

COUPLING ASSEMBLY AND RADIOFREQUENCY AMPLIFICATION SYSTEM HAVING THE SAME

CROSS-REFERENCE TO RELATED APPLICATIONS

The present application is a continuation-in-part of U.S. application Ser. No. 14/575,993 (U.S. Patent Application Publication 2016-0181994 A1), filed Dec. 18, 2014, which is incorporated herein by reference in its entirety.

The subject matter set forth herein is similar to subject matter described in U.S. application Ser. Nos. 14/575,885 (U.S. Pat. No. 9,337,786); 14/575,914 (U.S. Pat. No. 9,455,674); 14/575,958 (U.S. Pat. No. 9,456,532), each of which was filed on Dec. 18, 2014. Each of the above applications is incorporated herein by reference in its entirety.

BACKGROUND

The subject matter herein relates generally to radiofrequency (RF) power generators and, more particularly, to mechanisms and methods for tuning a RF amplification system in an RF power generator.

Radioisotopes (also called radionuclides) have several applications in medical therapy, imaging, and research, as well as other applications that are not medically related. Systems that produce radioisotopes typically include a particle accelerator, such as a cyclotron, that accelerates a beam of charged particles (e.g., H⁻ ions) and directs the beam into a target material to generate the isotopes. The cyclotron includes a particle source that provides the particles to a central region of an acceleration chamber. The cyclotron uses electrical and magnetic fields to accelerate and guide the particles along a predetermined orbit within the acceleration chamber. The magnetic fields are provided by electromagnets and a magnet yoke that surrounds the acceleration chamber. The electrical fields are generated by a pair of radio frequency (RF) electrodes (or dees) that are located within the acceleration chamber. The RF electrodes are electrically coupled to an RF power generator that may include, for example, oscillators, amplifiers, control circuitry, and power supplies. The RF power generator energizes the RF electrodes to provide the electrical field. The electrical and magnetic fields within the acceleration chamber cause the particles to take a spiral-like orbit that has an increasing radius. When the particles reach an outer portion of the orbit, the particles are directed toward the target material for radioisotope production. In addition to controlling the orbit of the particles, the RF electrodes may be used to pull the particles from a particle source in the acceleration chamber.

To operate the RF electrodes within the acceleration chamber, a considerable amount of electric power (e.g., 5 kW to 2 MW) is generated by the RF power generator and delivered to the RF electrodes. The RF power generator includes, among other things, an enclosure that has a RF amplification system including a power electron vacuum tube. The power electron vacuum tube is hereinafter referred to as a power tube. The power tube may be, for example, a power triode having a cathode, anode, and control grid. The power tube may also be a tetrode or pentode. The RF amplification system may also include one or more resonators that each have an inner conductor and an outer conductor.

The RF amplification system may operate at high frequencies, such as within the very high frequency (VHF) range or higher. When operating at such frequencies, each substantial component within the RF amplification system may have an effect on the ultimate performance of the RF amplification system. Due to the number of interconnected components and the manufacturing tolerances for each component, it is often necessary to tune the RF amplification system to achieve a designated performance. For example, it may be necessary to adjust a length of a resonator within the RF amplification system by moving a shorting deck. For systems that use a coupling loop, moving the shorting deck may render it necessary to re-position the coupling loop.

Adjustments such as those described above can be expensive and/or time-consuming. Moreover, due to the number of components and manufacturing tolerances, the overall tuning process (e.g., number, order, and extent of adjustments) for one system is often different than the tuning processes for other systems. RF amplification systems and coupling loops that allow for a more robust or repeatable tuning process are desired.

BRIEF DESCRIPTION

In an embodiment, a radiofrequency (RF) amplification system is provided that includes a plurality of conductor walls extending parallel to a longitudinal axis and defining an interior space therebetween. The RF amplification system also includes a shorting deck that extends transverse to the longitudinal axis. The shorting deck is electrically coupled to the conductor walls. The RF amplification system also includes a movable tray assembly having a grounding deck that extends parallel to the shorting deck. The grounding deck and the shorting deck define an output cavity therebetween that has a length measured along the longitudinal axis. The movable tray assembly is removably mounted to at least one of the conductor walls such that the grounding deck is capable of being positioned at multiple different levels along the longitudinal axis to change the length of the output cavity.

In an embodiment, a movable tray assembly configured to be a part of a RF amplification system. The movable tray assembly includes a grounding deck having an input side and an output side that face in opposite directions. The movable tray assembly also includes a sidewall extending away from the input side of the grounding deck. The movable tray assembly also includes a shorting deck extending parallel to the grounding deck. The sidewall extends between and mechanically and electrically couples the grounding deck and the shorting deck. The grounding deck, the sidewall, and the shorting deck define an input cavity. The grounding deck, the sidewall, and the shorting deck are configured to have fixed positions with respect to one another and move as a unit when the movable tray assembly is moved for positioning with respect to the RF amplification system.

In an embodiment, a tuning capacitor assembly is provided. The tuning capacitor assembly includes a connector wall that surrounds a central axis and defines a thru-hole that is configured to receive a power tube. The connector wall has an inner side that faces inward toward the central axis and an outer side that faces outward. The tuning capacitor assembly also includes a tuning sheet that surrounds the central axis and interfaces with the connector wall. The tuning sheet has an inner side that faces inward toward the central axis and an outer side that faces outward. The outer sides of the connector wall and the tuning sheet form a combined capacitive surface. The tuning sheet is movable along the central axis to adjust an amount of the combined capacitive surface.

In an embodiment, a RF amplification system is provided that includes a power cavity defined by a grounding deck, an inner conductor, and an outer conductor of the RF amplification system. The RF amplification system also includes a coupling loop operably positioned within the power cavity between the inner conductor and the outer conductor. The coupling loop includes a secured segment that is coupled to the grounding deck and a movable segment that is coupled to the secured segment. The secured segment extends between the grounding deck and the movable segment. The coupling loop defines a loop region. The movable segment is movable relative to the secured segment while the secured segment is stationary to change a size of the loop region and thereby change the amount of inductive coupling.

In some aspects, the loop region includes a fixed section and an adjustable section. The secured segment defines a boundary of the fixed section. At least a portion of the fixed section of the loop region exists between the adjustable section of the loop region and the secured segment. The fixed section of the loop region determines a baseline portion of the amount of inductive coupling. The adjustable section of the loop region increases the amount of inductive coupling from the baseline portion. Optionally, the amount of inductive coupling increases in a substantially gradual manner as the amount of inductive coupling increases from the baseline portion to a maximum of the amount of inductive coupling. Optionally, the baseline portion is at least 30% of a maximum of the amount of inductive coupling.

In some aspects, the coupling loop is connected to the grounding deck at a first conductor interface, and the secured segment and the movable segment are connected to each other at a second conductor interface. The first and second conductor interfaces have fixed positions with respect to each other when the movable segment is moved. The secured segment extends between the first and second conductor interfaces. The secured segment may or may not have a non-linear shape.

In some aspects, the secured segment is a first secured segment and the coupling loop also includes a second secured segment that is electrically coupled to an output conductor of the RF amplification system. The movable segment extends between and electrically joins the first and second secured segments. The movable segment is movable relative to the first and second secured segments.

In some aspects, the RF amplification system also includes a capacitor positioned in series with the secured segment and the movable segment.

In some aspects, the movable segment is rotatable about an axis of rotation that extends generally parallel to the grounding deck. The coupling loop has a three-dimensional structure at one or more positions of the movable segment.

In some aspects, the RF amplification system also includes a coupling-control instrument that is attached to the coupling loop. The coupling-control instrument indicates how to move the movable segment to increase or decrease the amount of inductive coupling.

Optionally, the coupling-control instrument includes non-conductive material and has an indicator and at least one reference marker. A position of the indicator with respect to the at least one reference marker approximates the amount of inductive coupling. The indicator or the at least one reference marker is attached to the movable segment and moves with the movable segment while the other has a stationary position.

In an embodiment, a coupling assembly is provided that is configured to transfer power to a load. In some aspects, the coupling assembly is used with an RF amplification system for a particle accelerator. In other aspects, however, the coupling assembly may be used to transfer power to other loads. The coupling assembly includes a first secured segment configured to mechanically and electrically couple to a ground and a second secured segment configured to mechanically and electrically couple to an output conductor. The coupling assembly also includes a movable segment configured to extend between and join the first and second secured segments thereby forming a coupling loop. The movable segment is movable relative to each of the first and second secured segments while connected to the first and second secured segments. The coupling loop is configured to define a loop region. The movable segment is movable relative to the first and second secured segments to change a size of the loop region and thereby change the amount of inductive coupling.

In some aspects, the loop region includes a fixed section and an adjustable section. The first secured segment defines a boundary of the fixed section. The movable segment is movable relative to the first and second secured segments to change a size of the adjustable section of the loop region and thereby change the amount of inductive coupling. At least a portion of the fixed section of the loop region exists between the adjustable section of the loop region and the first secured segment. The fixed section of the loop region determines a baseline portion of the amount of inductive coupling. The adjustable section of the loop region increases the amount of inductive coupling from the baseline portion.

In some aspects, the coupling assembly also includes a capacitor positioned in series with the movable segment and the first and second secured segments.

In some aspects, the first secured segment is designed to be positioned in a region with a stronger magnetic field than a region where the second secured segment is positioned.

In some aspects, the coupling assembly also includes a coupling-control instrument that is attached to the coupling loop. The coupling-control instrument indicates how to move the movable segment to increase or decrease the amount of inductive coupling.

Optionally, the coupling-control instrument includes non-conductive material and has an indicator and at least one reference marker. A position of the indicator with respect to the at least one reference marker approximates the amount of inductive coupling. The indicator or the at least one reference marker is attached to the movable segment and moves with the movable segment while the other has a stationary position.

In an embodiment, a method of tuning a radio-frequency (RF) amplification system is provided. The method includes providing a resonator that includes an inner conductor and an outer conductor that define a power cavity therebetween. A coupling loop is positioned within the power cavity between the inner conductor and the outer conductor. The coupling loop includes a secured segment that is electrically coupled to a grounding deck and a movable segment that is mechanically and electrically coupled to the secured segment. The secured segment extends between the grounding deck and the movable segment. The method also includes moving the movable segment of the coupling loop relative to the secured segment to change a size of a loop region of the coupling loop.

In some aspects, the secured segment is a first secured segment and the coupling loop further comprises a second secured segment that is electrically coupled to an output.

The movable segment extends between and electrically joining the first and second secured segments. The movable segment is movable relative to the first and second secured segments.

In some aspects, the coupling loop includes a capacitor positioned in series with the movable segment and the second secured segment.

In some aspects, the resonator includes a coupling-control instrument that is attached to the coupling loop. The coupling-control instrument indicates how to move the movable segment to increase or decrease the amount of inductive coupling.

DETAILED DESCRIPTION

Figure 1:
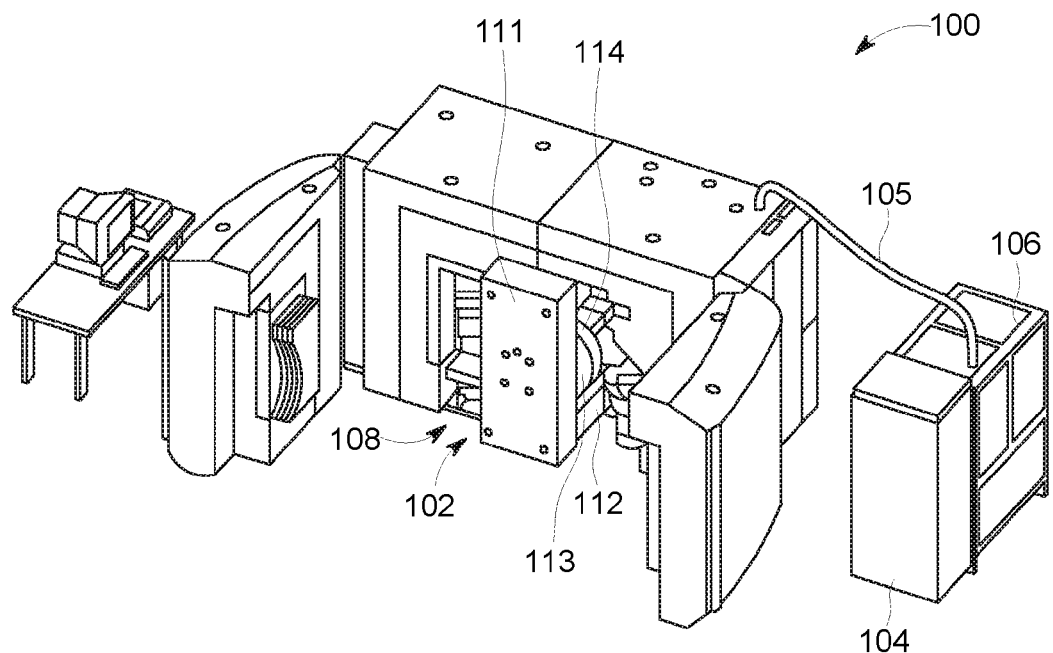
FIG. 1 is a perspective view of an isotope production system in accordance with an embodiment.

The following detailed description of certain embodiments will be better understood when read in conjunction with the appended drawings. To the extent that the figures illustrate diagrams of the functional blocks of various embodiments, the functional blocks are not necessarily indicative of the division between hardware circuitry. For example, one or more of the functional blocks (e.g., processors or memories) may be implemented in a single piece of hardware (e.g., a general purpose signal processor or a block of random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated, such as by stating "only a single" element or step. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Embodiments set forth herein include radio-frequency (RF) power generators that include a power tube and at least one resonator coupled to the power tube. Embodiments may also include movable tray assemblies, RF amplification systems (or RF amplifier systems), tuning capacitor assemblies, and methods regarding the same. The resonators may include input and output cavity resonators that may be, for example, coaxial transmission line resonators that each include an inner conductor and an outer conductor. The input and output cavity resonators may be characterized as high-Q resonators that are configured to operate at a designated frequency, such as within the very high frequency (VHF) band or higher. As one example, the designated frequency may be 100 MHz. The input and output cavity resonators may be ¼ wavelength resonators (or λ/4 resonators). Although the RF power generator and the RF amplification system described herein is used to supply power to a particle accelerator, it should be understood that the RF power generator and the RF amplification system may be used in other applications. In particular embodiments, the RF power generator or RF amplification system is a high power system that is capable of generating, for example, 1,000 W or more and 500 V or more.

A technical effect provided by one or more embodiments may include one or more robust and reliable mechanisms for coarse tuning resonators and/or fine tuning the resonators. Another technical effect may include a movable tray assembly that includes a plurality of operative components of a RF amplification system that are coupled in substantially fixed positions with respect to a grounding deck of the RF amplification system. The movable tray assembly may allow a technician to assemble, test, and/or tune the operative components prior to the movable tray assembly being positioned within and incorporated into the RF amplification system. The movable tray assembly may also allow a technician to remove the movable tray assembly from the RF amplification system and then repair, service, test, and/or tune one or more operative components of the movable tray assembly outside of the RF amplification system. For example, the movable tray assembly may permit the technician to turn the movable tray assembly upside down relative to the orientation of the movable tray assembly within the RF amplification system. In the upside-down orientation, the technician may position the movable tray assembly on a support structure (e.g., bench), which may provide easier access to certain operative components, such as the operative components of an input cavity resonator. When the movable tray assembly is positioned within the RF amplification system, the grounding deck and the plurality of components may move as a unit.

Another technical effect may include a mechanism for fine tuning one of the resonators in a more robust and reliable manner than conventional mechanisms. Another technical effect may include tuning a RF amplification system generally by moving only a segment of a coupling loop. This tuning may be less sensitive than other conventional mechanisms or systems. Another technical effect may include more simplified processes for assembling, repairing, servicing, and/or tuning a RF amplification system. In particular embodiments, the movable tray assembly may reduce an amount of time that is typically taken by a technician to replace an operative component of the RF amplification system and tune the RF amplification system. The reduction in time may be, for example, at least thirty (30) minutes, at least one (1) hour, or at least two (2) hours.

FIG. 1 is a perspective view of an isotope production system 100 in accordance with an embodiment. The isotope production system 100 includes a particle accelerator 102 that is operably coupled to a control cabinet 104 and a RF power generator 106. In the illustrated embodiment, the particle accelerator 102 is an isochronous cyclotron, but other types of particle accelerators may be used. RF energy or power is supplied to the particle accelerator 102 through an RF cable 105. As shown, the particle accelerator 102 includes a magnet assembly 108 that includes yoke sections 111, 112 and electromagnets 113, 114 that are coupled to the yoke sections 111, 112, respectively.

Figure 2:
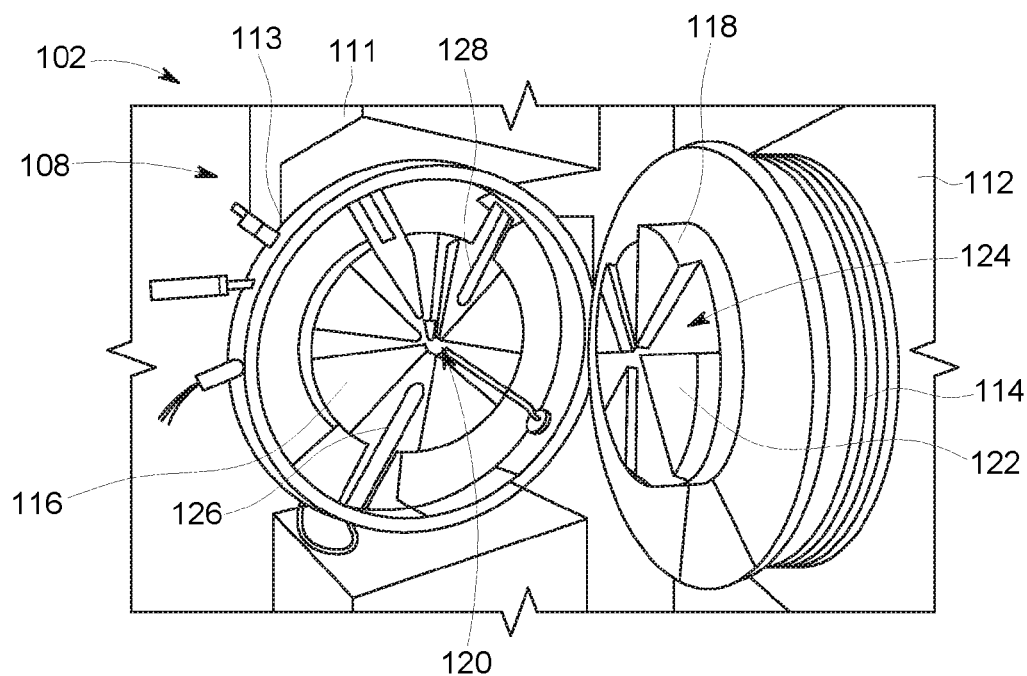
FIG. 2 illustrates a perspective view of the isotope production system of FIG. 1 having a cyclotron that is opened to illustrate components of the cyclotron.

FIG. 2 is a perspective view of a portion of the particle accelerator 102. Although the following description is with respect to the particle accelerator 102 being a cyclotron, it is understood that embodiments may include other particle accelerators and sub-systems of the same. As shown in FIG. 2, the particle accelerator 102 includes the magnet assembly 108 having the yoke sections 111, 112 and the electromagnets 113, 114. The electromagnets 113, 114 are magnet coils in the illustrated embodiment. The particle accelerator 102 may also include pole tops 116, 118. The pole top 116 is secured to the yoke section 111, and the pole top 118 is secured to the yoke section 112. As shown, the yoke section 112 is rotatably coupled to the yoke section 111. During operation, the yoke section 112 is in a closed position (as shown in FIG. 1) such that the pole tops 116, 118 oppose each other and an acceleration chamber is defined therebetween. When the particle accelerator 102 is not operating, the yoke section 112 may be opened to allow access to the acceleration chamber.

The acceleration chamber is configured to allow charged particles, such as $^1H^-$ ions, to be accelerated therein along a predetermined curved path that wraps in a spiral manner about an axis that extends between centers of the opposing pole tops 116, 118. The charged particles are initially positioned proximate to a central region 120 of the acceleration chamber. When the particle accelerator 102 is activated, the path of the charged particles may orbit around the axis that extends between the pole tops 116, 118. In particular embodiments, the pole top 118 includes hills 122 and valleys 124. The particle accelerator 102 also includes a pair of RF electrodes 126, 128 that are positioned adjacent to the pole top 116. The RF electrodes 126, 128 are sized and shaped to be received within corresponding valleys 124 of the pole tope 118 when the yoke section 112 is closed.

The RF electrodes 126, 128 are configured to be energized by the RF power generator 106 (FIG. 1) to generate an electrical field. The magnetic field is provided by the yoke sections 111, 112 and the electromagnets 113, 114. When the electromagnets 113, 114 are activated, a magnetic flux may flow between the pole tops 116, 118 and through the yoke sections 111, 112 around the acceleration chamber. When the electrical field is combined with the magnetic field, the particle accelerator 102 may direct the particles along the predetermined orbit. The RF electrodes 126, 128 cooperate with each other and form a resonant system that includes inductive and capacitive elements tuned to a predetermined frequency (e.g., 100 MHz). Accordingly, the RF electrodes 126, 128 are controlled by the RF power generator 106 to accelerate the charged particles.

In particular embodiments, the system 100 uses $^1H^-$ technology and brings the charged particles (negative hydrogen ions) to a designated energy with a designated beam current. In such embodiments, the negative hydrogen ions are accelerated and guided through the particle accelerator 102. The negative hydrogen ions may then hit a stripping foil (not shown) such that a pair of electrons are removed and a positive ion, $^1H^+$ is formed. The positive ion may be directed into an extraction system (not shown). However, embodiments described herein may be applicable to other types of particle accelerators and cyclotrons. For example, in alternative embodiments, the charged particles may be positive ions, such as $^1H^+$, $^2H^+$, and $^3He^+$. In such alternative embodiments, the extraction system may include an electrostatic deflector that creates an electric field that guides the particle beam toward the target material.

The system 100 is configured to produce radioisotopes (also called radionuclides) that may be used in medical imaging, research, and therapy, but also for other applications that are not medically related, such as scientific research or analysis. When used for medical purposes, such as in Nuclear Medicine (NM) imaging or Positron Emission Tomography (PET) imaging, the radioisotopes may also be called tracers. By way of example, the system 100 may generate protons to make $^{18}$F$^-$ isotopes in liquid form, $^{11}$C isotopes as $CO_2$, and $^{13}$N isotopes as $NH_3$. The target material used to make these isotopes may be enriched $^{18}$O water, natural $^{14}$N$_2$ gas, $^{16}$O-water. In some embodiments, the system 100 may also generate protons or deuterons in order to produce $^{15}$O gases (oxygen, carbon dioxide, and carbon monoxide) and $^{15}$O labeled water.

The system 100 may also be configured to accelerate the charged particles to a predetermined energy level. For example, some embodiments described herein accelerate the charged particles to an energy of approximately 18 MeV or less. In other embodiments, the system 100 accelerates the charged particles to an energy of approximately 16.5 MeV or less. In particular embodiments, the system 100 accelerates the charged particles to an energy of approximately 9.6 MeV or less. In more particular embodiments, the system 100 accelerates the charged particles to an energy of approximately 7.8 MeV or less. However, embodiments describe herein may also have an energy above 18 MeV. For example, embodiments may have an energy above 100 MeV, 500 MeV or more. Likewise, embodiments may utilize various beam current values. By way of example, the beam current may be between about of approximately 10-30 µA. In other embodiments, the beam current may be above 30 µA, above 50 µA, or above 70 µA. Yet in other embodiments, the beam current may be above 100 µA, above 150 µA, or above 200 µA.

Figure 3:
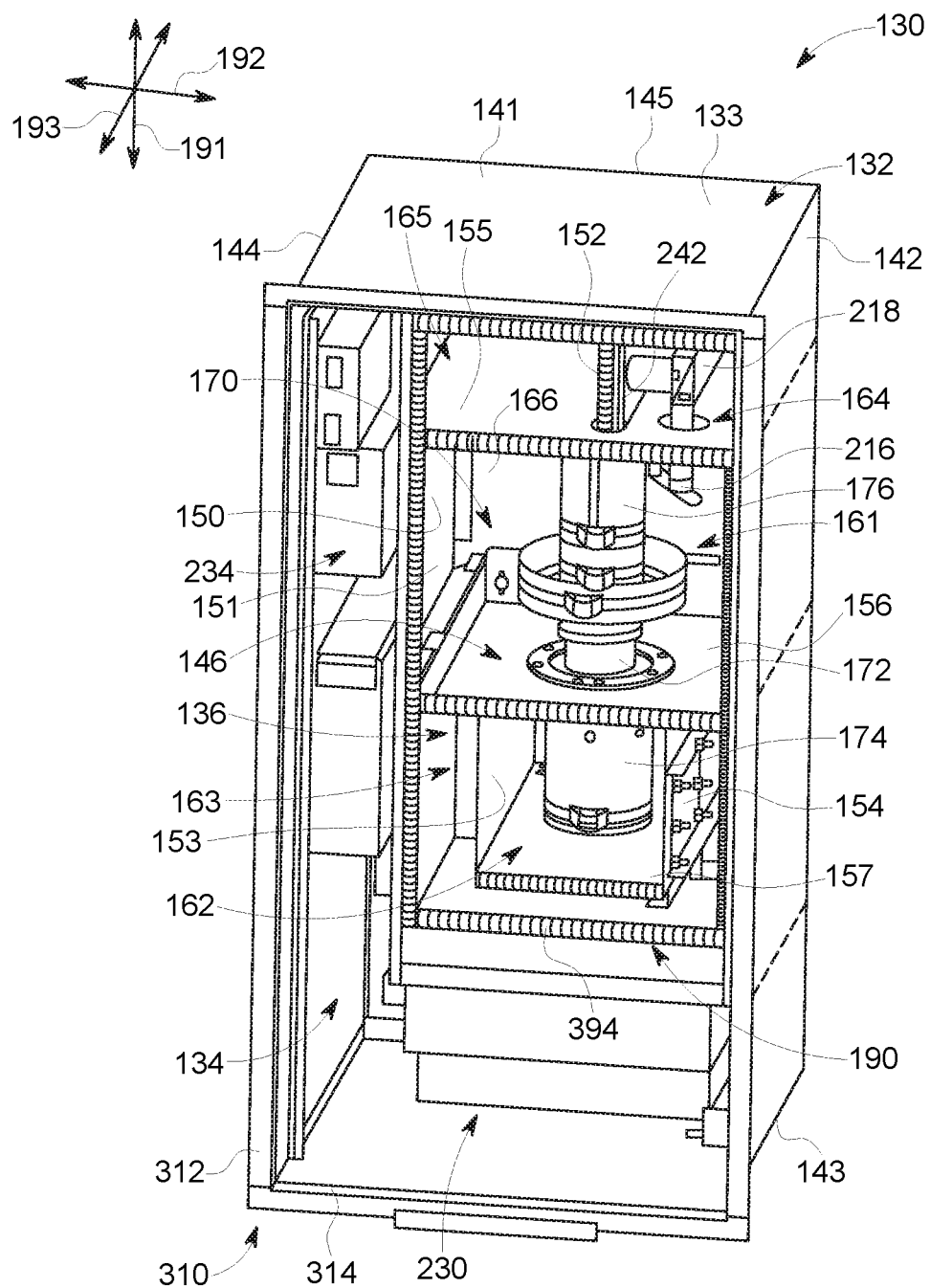
FIG. 3 is a perspective view of a radio frequency (RF) power generator having a RF amplification system in accordance with an embodiment.

FIG. 3 is a perspective view of a RF power generator 130, which may be used with an isotope production system, such as the isotope production system 100 (FIG. 1). It is contemplated, however, that the RF power generator 130 may be used in other applications that require RF power amplification. The RF power generator 130 may be similar to the RF power generator 106 (FIG. 1) and configured to energize RF electrodes, such as the RF electrodes 126, 128 (FIG. 2). The RF power generator 130 includes a generator housing 132, which may be referred to as a cabinet in some embodiments. The generator housing 132 houses a number of interconnected components of the RF power generator 130 that cooperate in generating a sufficient amount of electric power for operating the RF electrodes. The generator housing 132 includes a system cavity 134 where a number of electrical systems are located for generating electric power.

The generator housing 132 includes an outer enclosure 133 having external walls 141-145. The outer enclosure 133 includes the system cavity 134 and separates the system cavity 134 from an exterior of the RF power generator 130. For example, the external walls 141-145 may face an exterior or external environment that is readily accessible to individuals and/or that has equipment positioned adjacent to one or more of the external walls 141-145. The generator housing 132 and other internal shielding structures may be configured to obtain a designated electromagnetic compliance (EMC). More specifically, the generator housing 132 may be configured to reduce leakage of electromagnetic radiation into the exterior.

As shown, the RF power generator 130 is oriented with respect to mutually perpendicular axes, including a longitudinal axis 191, a lateral axis 192, and a depth axis 193. The lateral axis 192 extends laterally between the external walls 142, 144. The longitudinal axis 191 may be a vertical axis that extends parallel to the force of gravity, and the depth axis 193 may extend into the system cavity 134. It is contemplated that the longitudinal axis 191 in other embodiments may not extend parallel to the force of gravity.

The generator housing 132 may also include an inner enclosure 150 that is positioned within the system cavity 134. The inner enclosure 150 may include interior walls 151-158 that form a plurality of compartments 161-165. As shown, the interior walls 151-154 are vertical walls that extend parallel to a plane defined by the longitudinal and depth axes 191, 193. In the illustrated embodiment, the interior wall 151 extends along an entire height of the inner enclosure 150, which is less than a height of the outer enclosure 133. The interior walls 155-157 may be horizontal walls that extend parallel to a plane defined by the lateral axis 192 and the depth axis 193. The interior walls 151-158 may interconnect with one another to form the compartments 161-165.

The compartments 161-165 may also be partially defined by the outer enclosure 133. For example, the external wall 145 includes an interior surface 166 that may define a back end of the compartments 161-165. The external wall 142 may include an interior surface (not shown) that defines a side of the compartments 161, 162, 164.

The interior wall 156 forms a portion of a grounding deck 146. As described in greater detail with respect to FIG. 4, the interior walls 155, 157 may also be characterized as grounding decks or shorting decks. The interior wall 155 is hereinafter referred to as the output shorting deck 155 or simply the shorting deck 155. The compartment 161 may be referred to as the power compartment (or first power compartment or power cavity). The compartment 161, when referred to individually, is hereinafter referred to as the power cavity 161. The compartment 162 may be referred to as the power compartment (or second power compartment). In particular embodiments, the power compartment 162 is an input cavity or cathode cavity. The compartment 164 may be referred to as the port compartment. In the illustrated embodiment, the power cavity 161 and the port compartment 164 share the interior wall 155 such that the interior wall 155 separates the power cavity 161 and port compartment 164.

The RF power generator 130 includes an RF amplification system 170 that is disposed in the system cavity 134. In the illustrated embodiment, the RF amplification system 170 is positioned within at least one of the compartments 161-165. In certain embodiments, the RF amplification system 170 includes a power tube 172 and input and output inner conductors 174, 176. The power tube 172 is coupled to the interior wall 156 and the grounding deck 146. The RF amplification system 170 may form an input cavity resonator 178 (referenced in FIG. 9) that includes the input inner conductor 174 and an output cavity resonator 180 (referenced in FIG. 9) that includes the output inner conductor 176. The input and output inner conductors 174, 176 are inner conductors of the corresponding input and output cavity resonators 178, 180. The input cavity resonator 178 may include an input outer conductor 182 (referenced in FIG. 9) that is formed by the interior walls 153, 154, the external wall 145, and a movable access panel 252 (shown in FIG. 9). The input outer conductor 182 surrounds the input inner conductor 174. The output cavity resonator 180 may include an output outer conductor 184 (referenced in FIG. 9) that is formed by the interior wall 151, the external walls 142, 145, and the movable access panel 252. The output outer conductor 184 surrounds the output inner conductor 176. The output cavity resonator 180 is also defined by the interior wall 156 of the grounding deck 146 and the grounding deck 155.

In the illustrated embodiment, the input and output cavity resonators 178, 180 interact with the power tube 172 to produce electric power for energizing, for example, a particle accelerator. The electric power is transferred by a coupling loop 216 that is disposed within the power cavity 161. The RF amplification system 170 may be capable of producing, for example, at least 5 kilowatts of electric power. In some embodiments, the RF amplification system 170 is capable of producing at least 8 kilowatts or at least 10 kilowatts.

During operation, the RF amplification system 170 may emit electromagnetic radiation while producing the electric power. In an exemplary embodiment, the power tube 172 is a power triode that includes a cathode, anode, and control grid (not shown). The cathode may be heated by a filament that receives current from a power supply (not shown). The heated filament causes the cathode to emit electrons, which flow through the power tube 172 toward the anode. The control grid is positioned between the cathode and anode and may be used to control the flow of the electrons. Although the power tube 172 is a power triode in some embodiments, it should be understood that other power tubes may be used, such as tetrodes or pentodes. Moreover, although the above describes one type of RF amplification system, it should be understood that other embodiments may include another type of RF amplification system.

In some embodiments, the grounding deck 146 is capable of being moved to change a size of the power cavity 161 and/or electrical performance of the output cavity resonator 180. In particular embodiments, the RF amplification system 170 includes a movable tray assembly 136 that has a plurality of interconnected components of the RF amplification system 170. For example, the movable tray assembly 136 includes the grounding deck 146, the power tube 172, the interior walls 153, 154, 157, and the input inner conductor 174. The movable tray assembly 136 may allow for the components to be assembled, serviced, and/or tested outside of the generator housing 132 and then moved, as a unit, into the system cavity 134. The movable tray assembly 136 may be movable to different levels along the longitudinal axis 191. Moving the movable tray assembly 136 along the longitudinal axis 191 may effectively change a length of one or more cavity resonators 178, 180 of the RF amplification system 170. In some embodiments, moving the movable tray assembly 136 along the longitudinal axis 191 may be referred to as coarse tuning the RF amplification system 170.

Figure 9:
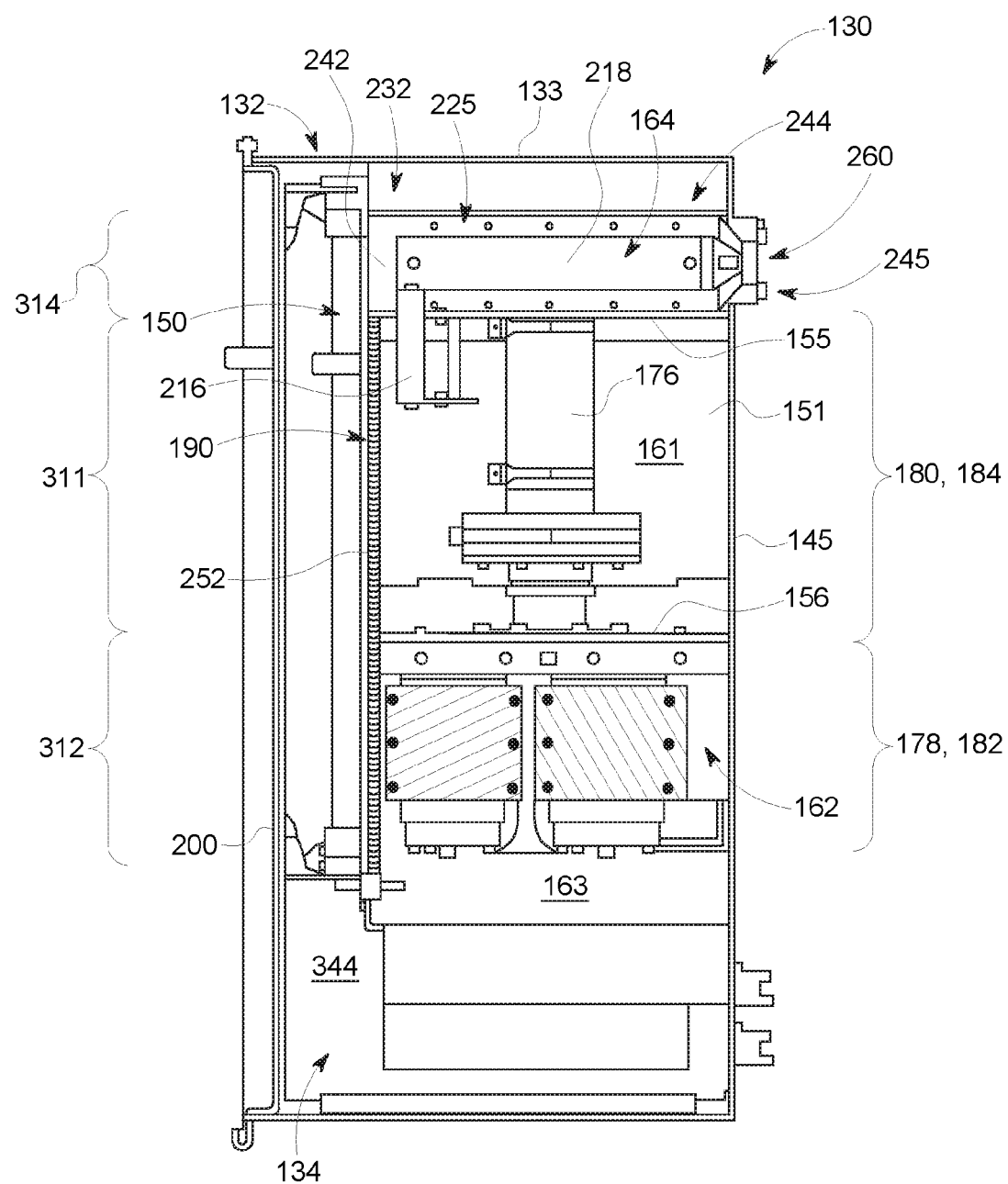
FIG. 9 is a side cross-section of the RF power generator of FIG. 3.

The inner enclosure 150 may also include a conductive frame 190 that is configured to engage the movable access panel 252 (FIG. 9). The conductive frame 190 includes a plurality of flexible conductive elements 394 (e.g., contact springs, spring fingers, and the like) that are distributed along respective edges the interior walls 151-158. The conductive frame 190 may surround and define access openings to the respective compartments 161-165. The inner enclosure 150 may also include locking devices that are configured to engage the movable access panel 252 and hold the movable access panel 252 against the conductive elements 394 of the conductive frame 190.

Figure 4:
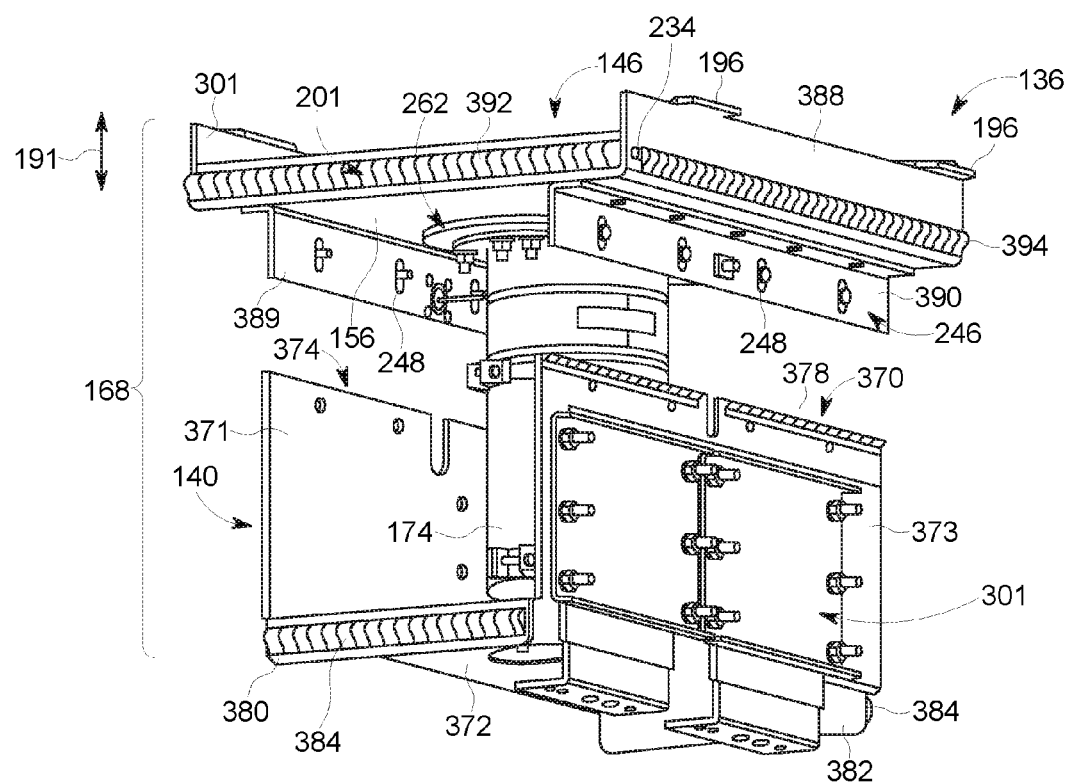
FIG. 4 is a partially exploded view of a movable tray assembly formed in accordance with an embodiment.

FIG. 4 is a partially exploded view of the movable tray assembly 136 in accordance with an embodiment. It should be understood that FIG. 4 and the accompanying description illustrate just one example of a movable tray assembly and that other embodiments may be assembled in accordance with the teachings herein. As shown in FIG. 4, the grounding deck 146 and a conductor sub-assembly 140 have been separated. The movable tray assembly 136 may include the input inner conductor 174 and a multi-disc capacitor 262 that couples the input inner conductor 174 to the grounding deck 146. The multi-disc capacitor 262 is described in greater detail in U.S. Pat. No. 9,455,674, which is incorporated herein by reference in its entirety.

The conductor sub-assembly 140 may include a plurality of ground walls 371-373. In the illustrated embodiment, the ground walls 371-373 form a U-shaped structure, but other shapes may be formed by the ground walls 371-373. The ground wall 372 extends between and joins the ground walls 371, 373 and includes a plurality of the apertures for airflow. The ground wall 372 may be referred to as a grounding deck or a shorting deck. The ground walls 371, 373 may project away from the input side of the grounding deck 146. The ground wall 372 is configured to electrically couple to the input inner conductor 174. The ground walls 371, 373 may include coupling edges 374, 376, respectively, that are configured to electrically couple to the grounding deck 146. For example, the ground walls 371, 373 may include conductive elements 378 along the coupling edges 374, 376.

Also shown in FIG. 4, the conductor sub-assembly 140 may include a front grounding panel 380 and a rear grounding panel 382 that each include a plurality of flexible conductive elements 384. The conductive elements 384 along the front grounding panel 380 may be configured to engage the access panel 252 (FIG. 9), and the conductive elements 384 along the rear grounding panel 382 may be configured to engage an interior surface of a conductor wall 222 (shown in FIG. 7). For example, conductive elements may include elongated bodies (e.g., beams) that are configured to resiliently flex when engaging another component. When engaged to the other component, the conductive elements may have a stored energy that continuously biases the conductive element against the other component so that the conductive elements contact and remain engaged to the other component during operation of the RF power generator 130 (FIG. 3).

The grounding deck 146 includes the interior wall 156, a pair of sidewalls 387, 388, and a pair of structure supports 389, 390. The interior wall 156 includes flexible conductive elements 392 positioned along a front end 201 of the grounding deck 146 that are configured to engage the access panel 252 (FIG. 9). Also shown, the sidewall 388 may have a mounting hole 324 that is proximate to the front end 201. The sidewall 387 may also include a mounting hole 322 (shown in FIG. 5). The grounding deck 146 may also include conductive elements 395 (shown in FIG. 6) along a back end that are configured to engage an interior surface of the generator housing 132. Likewise, the sidewall 388 may include conductive elements 394 positioned therealong that are configured to engage an interior surface of the generator housing 132. The sidewall 387 may also include conductive elements 394 (shown in FIG. 5) positioned therealong for engaging another interior surface of the generator housing 132.

The structure supports 389, 390 are secured to the interior wall 156 and are configured to couple to the ground walls 371, 373, respectively. The conductive elements 378 may engage the structure supports 389, 390. The structure supports 389, 390 may be L-shaped. In an exemplary embodiment, the conductor sub-assembly 140 is capable of being positioned at different distances with respect to the grounding deck 146. For example, the movable tray assembly 136 includes hardware 246 and slots 248 that receive the hardware 246. The hardware 246 is used to secure the ground walls 371, 373 to the structure supports 389, 390, respectively. The ground walls 371, 373 include corresponding holes that receive the hardware 246. As shown, the slots 248 extend lengthwise along the longitudinal axis 191. The slots 248 permit the conductor sub-assembly 140 to be positioned at different distances relative to the grounding deck 146. In particular, the ground wall 372 (or the shorting deck 372) may be positioned at different distances with respect to the grounding deck 146 to change a length of the input cavity 162 (FIG. 3).

Accordingly, the support frame 168 may provide conductive paths that extend from the ground walls 371, 373 to one or more of the conductive elements 384, 392, and 394 and, consequently, to the generator housing 132. The ground walls 371, 373 may be configured to electrically ground decoupling capacitors 301. Moreover, the ground walls 371, 373 may form part of the input outer conductor 182 of the input cavity resonator 178.

Also shown in FIG. 4, the support frame 168 may include blocking tabs 196 that extend laterally away from the sidewalls 387, 388. Returning to FIG. 3, when the movable tray assembly 136 is positioned within the interior space 175, the movable tray assembly 136 is positioned between a ledge support 198 and a ledge support 199 (FIG. 7) of the generator housing 132. For example, the grounding deck 146 may extend between and be electrically coupled to inner surfaces of the ledge supports 198, 199. During the positioning process, the movable tray assembly 136 may be initially positioned above the ledge supports 198, 199 and then lowered in a direction along the longitudinal axis 191 such that a portion of the movable tray assembly 136 extends between the ledges supports 198, 199. The blocking tabs 196 may be configured to prevent the movable tray assembly 136 from moving completely through the opening between the ledge supports 198, 199. In alternative embodiments, the blocking tabs 196 may not be used and, instead, the ledge supports 198, 199 may include tabs that prevent the movable tray assembly 136 from moving completely through the opening between the ledge supports 198, 199.

Figure 5:
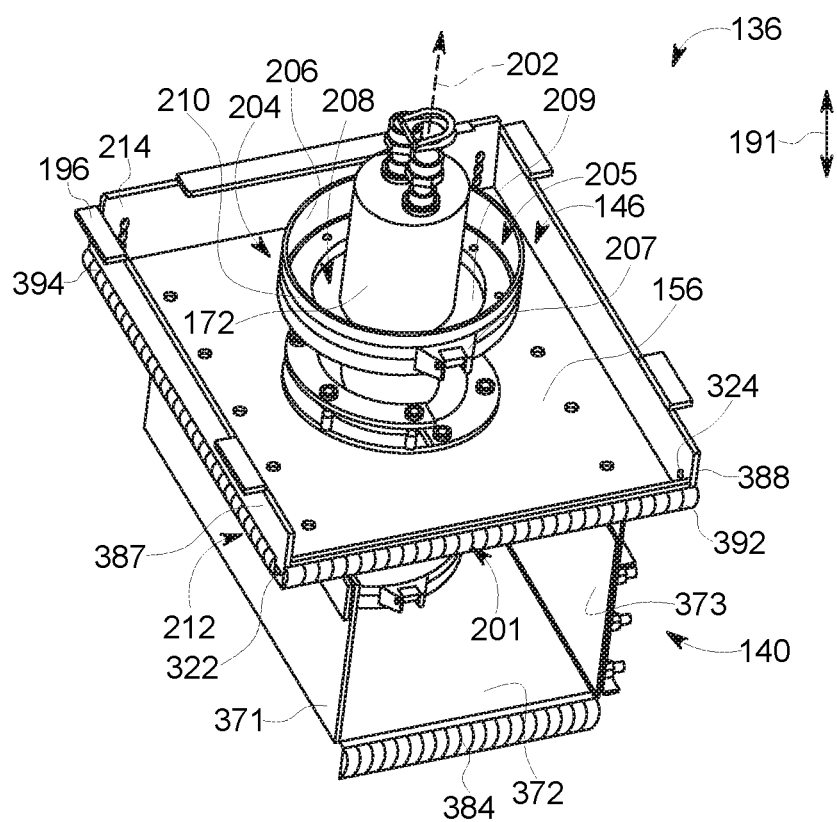
FIG. 5 is perspective view of the movable tray assembly of FIG. 4 including a tuning capacitor assembly formed in accordance with an embodiment.

FIG. 5 is a top perspective view of the movable tray assembly 136. As shown, a central axis 202 extends parallel to the longitudinal axis 191 and through a geometric center of the power tube 172. The interior wall 156 of the grounding deck 146 and the shorting deck 372 extend transverse (or perpendicular) to the central axis 202. The ground walls 371, 373 and the sidewalls 387, 388 extend parallel to the central axis 202. The central axis 202 may also extend through centers of an output cavity resonator 180 (shown in FIG. 9) and an input cavity resonator 178 (shown in FIG. 9) that are partially defined by the movable tray assembly 136.

Also shown, the movable tray assembly 136 includes the tuning capacitor assembly 204. The tuning capacitor assembly 204 may be used to fine tune the RF amplification system 170 (FIG. 3) and, in particular, the output cavity resonator 180. In the illustrated embodiment, the tuning capacitor assembly 204 includes an output connector 205 having a connector wall 206 that surrounds the central axis 202 and defines a thru-hole 208 that receives the power tube 172. Optionally, the output connector 205 is mounted onto an anode electrode 209 of the power tube 172. The tuning capacitor assembly 204 also includes a tuning sheet 210 that surrounds the central axis 202 and interfaces with the connector wall 206. The tuning sheet 210 may be held against the connector wall 206 using a fastener, such as a belt 207.

In the illustrated embodiment, the tuning sheet 210 is located along an exterior of the connector wall 206. In other embodiments, the tuning sheet 210 may be located along an interior of the connector wall 206. As described herein, the tuning sheet 210 may be movable along the central axis 202 to adjust an amount of combined capacitive surface that is exposed within the output cavity resonator 180 (FIG. 9). Adjusting the amount of the combined capacitive surface may be at least one process used to fine tune the RF amplification system 170 and, in particular, the output cavity resonator 180. In an exemplary embodiment, the tuning capacitor assembly 204 is an annular capacitor assembly in which both the output connector 205 and the tuning sheet 210 are annular or ring-shaped. It is contemplated that the tuning capacitor assembly 204 may have other shapes in alternative embodiments.

Figure 7:
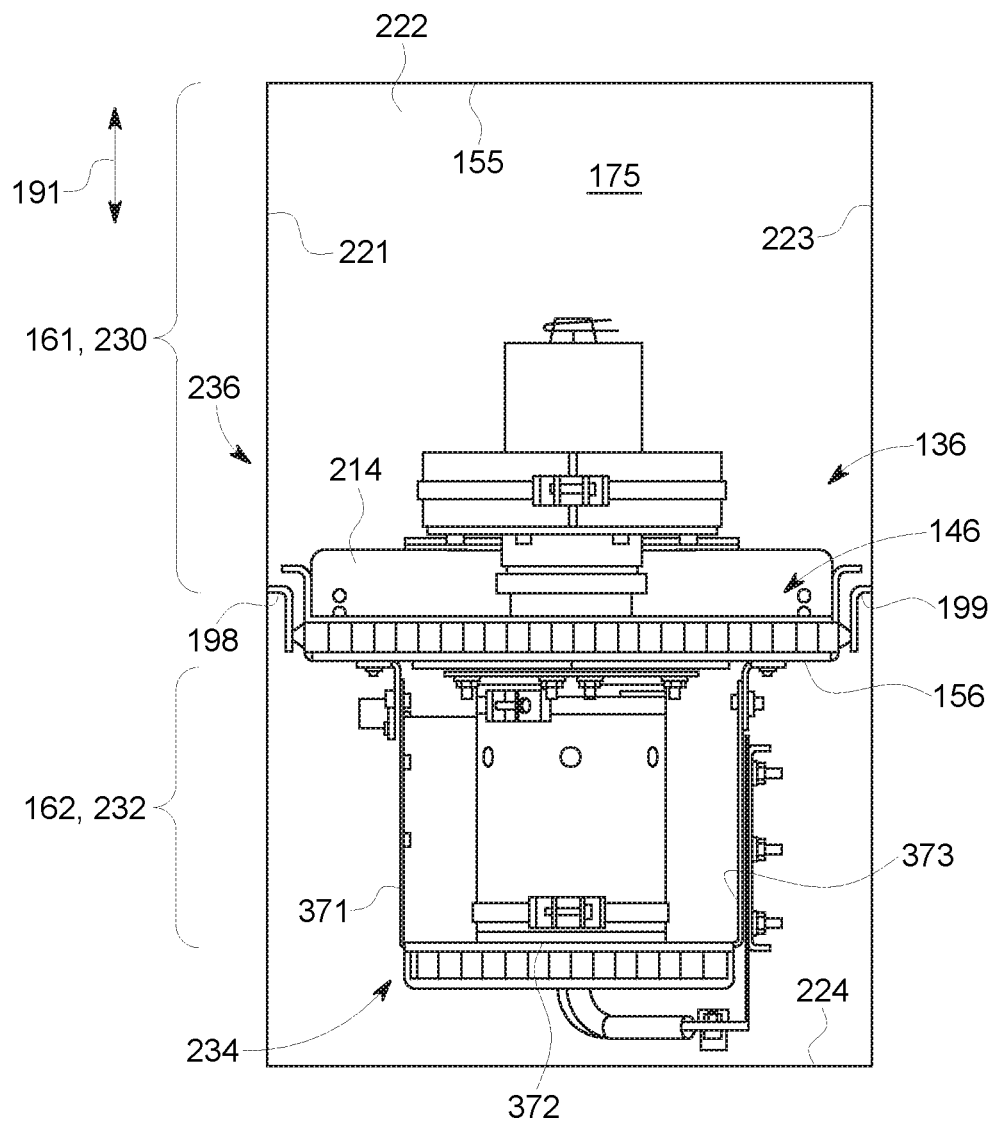
FIG. 7 is a front end view of the movable tray assembly of FIG. 4 within an interior space defined by conductor walls.

The movable tray assembly 136 includes exterior or outer surfaces that are electrically conductive and configured to engage conductor walls of the RF power generator 130 when the movable tray assembly 136 is positioned within the interior space 175 (FIG. 7). For example, the exterior surfaces may be formed by the conductive elements 378, 384, 392, 394, and 395. The exterior surfaces may also be formed by sidewalls or panels that directly engage the conductor walls of the RF power generator. The grounding deck 146 may have a perimeter 212 that surrounds the grounding deck 146 (or the interior wall 156). In some embodiments, the perimeter 212 may represent the most lateral or radial portions of the grounding deck 146 with respect to the central axis 202, except for the blocking tabs 196. The conductive elements 392, 394 may form the perimeter 212. The perimeter 212 is configured to extend alongside and engage conductor walls 221-223 that define an output outer conductor 184 (FIG. 9) of the output cavity resonator 180 (FIG. 9). The conductive elements 384 are configured to engage conductor walls that partially define an input outer conductor 182 of the input cavity resonator 178 (FIG. 9).

Figure 6:
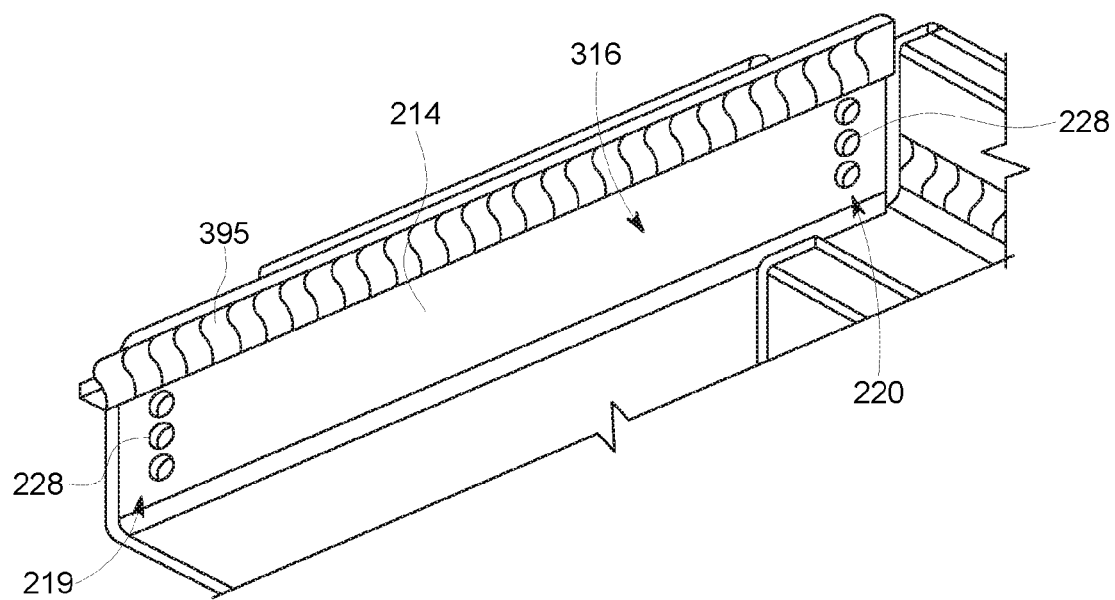
FIG. 6 illustrates a back surface of a securing panel of the movable tray assembly of FIG. 4.

Also shown in FIG. 5, the grounding deck 146 may include a securing panel 214 that is coupled to the interior wall 156 and, optionally, the sidewalls 387, 388. The securing panel 214 is also shown in FIG. 6. The securing panel 214 includes an outer surface 316 (FIG. 6) that is configured to interface with a conductor wall of the RF power generator 130. As used herein, the term "interface" includes two elements directly engaging each other and/or facing each other with a small gap therebetween. A row of the conductive elements 395 are positioned laterally along the outer surface 316. In certain embodiments, the securing panel 214 is configured to removably mount to the conductor wall 222. For example, the securing panel 214 includes at least one opening that is configured to receive hardware for removably mounting the securing panel 214 to the conductor wall 222. In the illustrated embodiment, the securing panel 214 includes a plurality of columns 219, 220 of mounting holes 228. Each of the mounting holes 228 is sized and shaped to receive, for example, a single nut or bolt. Each mounting hole 228 may be co-planar with respect to another mounting hole 228 in the opposite column. In an exemplary embodiment, each mounting hole 228 is spaced apart from adjacent mounting hole(s) 228 of the same column by about 10 millimeters (mm).

Returning to FIG. 5, the interior wall 156, the sidewalls 387, 388, and the securing panel 214 of the grounding deck 146 may be formed from a common sheet of conductive material (e.g., sheet metal). For example, a planar piece of sheet metal may be stamped or otherwise manufactured to include the interior wall 156, the sidewalls 387, 388, and the securing panel 214. The sidewalls 387, 388 and the securing panel 214 may be formed by bending or folding the sheet metal so that the sidewalls 387, 388 and the securing panel 214 extend perpendicular to the interior wall 156. Likewise, the conductor sub-assembly 140 may be formed from a common sheet of conductive material that is folded to form the ground walls 371-373.

In some embodiments, the movable tray assembly 136 may also be coupled to the generator housing 132 proximate to the front end 201 of the grounding deck 146. For example, the mounting holes 322, 324 of the sidewalls 387, 388, respectively, are configured to receive hardware (not shown) to secure the movable tray assembly 136 along the front end 201. The mounting holes 322, 324 may be used to secure the movable tray assembly 136 to the ledge supports 198, 199, respectively. By way of example, the mounting holes 322, 324 may align with holes (not shown) of the ledge supports 198, 199, respectively. Hardware (e.g., bolts) may be inserted through the aligned holes to secure the sidewalls 387, 388 to the respective ledge supports 198, 199. Alternatively, the movable tray assembly 136 may be mounted to an access panel 252 (FIG. 9) or other structure of the generator housing 132.

FIG. 7 is a front view of the movable tray assembly 136 positioned within the interior space 175. For illustrative purposes, other components of the RF amplification system 170 (FIG. 3) have been removed, such as the magnetic coupling loop 216 (FIG. 3) and the output inner conductor 176 (FIG. 3). The interior space 175 is defined by a plurality of conductor walls 221-223 that extend parallel to the longitudinal axis 191, a bottom wall 224, and the interior wall 155 (also referred to as the output shorting deck 155). The output shorting deck 155 and the bottom wall 224 extend transverse (or perpendicular) to the longitudinal axis 191. After the movable tray assembly 136 is positioned within the interior space 175, an access panel or wall 252 (FIG. 9) may be positioned in front of the movable tray assembly 136 and engage edges of the conductor walls 221-223, the grounding deck 146, and, optionally, the bottom wall 224.

When the movable tray assembly 136 and the access panel 252 are operably positioned, the output power cavity 161 and the input cavity 162 are formed. More specifically, the output power cavity 161 may be defined as the space that extends longitudinally between the output shorting deck 155 and the grounding deck 146 and laterally or radially between the conductors walls 221-223 and the access panel 252. The output shorting deck 155 and the grounding deck 146 define a length 230 of the output power cavity 161 (or the output cavity resonator 180) therebetween.

The input cavity 162 may be defined as the space that extends longitudinally between the input shorting deck 372 and the interior wall 156 and laterally or radially between the ground walls 371, 373, the access panel 252, and the conductor wall 222. The conductor wall 222 may form a back or rear boundary of the input shorting deck 372. The conductor wall 222 may be referred to as a mounting wall. The access panel 252 may form the front boundary of the input shorting deck 372. The input shorting deck 372 and the grounding deck 146 define an input length 232 of the input cavity 162 (or the input cavity resonator 178) therebetween. In particular embodiments, the input length 232 is fixed when the movable tray assembly 136 is moved for positioning within the interior space 175. More specifically, the input shorting deck 372 and the ground walls 371, 373 move with the movable tray assembly 136 as a unit when the movable tray assembly 136 is moved for positioning within the interior space 175. The input length 232 may be, for example, between 5 centimeters (cm) and 15 cm.

When the movable tray assembly 136 and the access panel 252 are operably positioned, the ground walls 371, 373, the access panel 252, and the conductor wall 222 form an input outer conductor 182 of the input cavity resonator 178. The input outer conductor 182 may have the input length 232. Likewise, when the movable tray assembly 136 and the access panel 252 are operably positioned, the access panel 252 and the conductor walls 221-223 form an output outer conductor 184 of the output cavity resonator 180. The output outer conductor 184 may have the output length 230.

The output length 230, however, is capable of being adjusted or changed by re-positioning the movable tray assembly 136. More specifically, the movable tray assembly 136 is capable of being positioned at multiple different levels along the longitudinal axis 191. Each level may have a corresponding axial position with respect to the longitudinal axis 191 or a corresponding depth relative to the output shorting deck 155. As used herein, the phrase "multiple different levels" includes discrete levels that are separate or spaced apart from each other, such that the movable tray assembly may have only a limited number of positions. However, the phrase "multiple different levels" may also include levels that are located along a continuous range, such that the movable tray assembly 136 may be positioned at any position between a maximum and minimum value of the range. In such embodiments, the movable tray assembly 136 may be slidable along at least one of the conductors walls 221-223.

As set forth herein, the movable tray assembly 136 may be removably mounted to at least one of the conductor walls 221-223. In the illustrated embodiment, the movable tray assembly 136 is removably mounted to the conductor wall 222. However, the movable tray assembly 136 may be removably mounted to the conductor wall 221 or the conductor wall 223 in other embodiments. Moreover, in the illustrated embodiment, the securing panel 214 is configured to be secured to the conductor wall 222 using hardware 240 (shown in FIG. 8).

As used herein, the phrase "removably mounted" means that a first component may be readily mounted and demounted with respect to a second component without destroying the first component or the second component. When mounted to the second component, the first component may have a fixed position with respect to the second component and have a designated or desired orientation with respect to the second component or other components. When demounted with respect to the second component, the first component is at least movable with respect to the second component. For example, when the movable tray assembly is demounted from the conductor wall(s), the movable tray assembly may be moved for positioning the movable tray assembly at one of a plurality of possible levels within the interior space. In some embodiments, the first component may not be completely separated from the second component when demounted from the second component. For example, the first component may be permitted to slide to another position with respect to the second component.

As used herein, the phrase "readily mounted and demounted" means the first component may be mounted to and demounted from the second component without undue effort or a significant amount of time spent in mounting or demounting. For example, the components may be coupled to one another using a limited amount of hardware, such as fasteners, screws, latches, buckles, nuts, bolts, washers, and the like, such that a technician may couple or uncouple the two components using only hands of the technician and/or tools (e.g., wrench). In some circumstances, more than one technician may perform the mounting or demounting process. In some embodiments, components that are removably mounted to each other may be coupled without hardware, such as by forming an interference or snap fit with respect to one another.

The components in the above examples may be the movable tray assembly 136 and at least one of the conductor walls 221-223. In some embodiments, the movable tray assembly 136 may be mounted to at least one conductor wall within a commercially reasonable period of time. For example, the movable tray assembly 136 may be mounted to at least one conductor wall such that the movable tray assembly 136 is secured to the conductor wall(s) in a fixed and desired position in less than ten (10) minutes. In particular embodiments, the movable tray assembly 136 may be mounted to at least one conductor wall such that the movable tray assembly 136 is secured to the conductor wall(s) in the fixed and desired position in less than five (5) minutes or, more particularly, in less than three (3) minutes. In more particular embodiments, the movable tray assembly 136 may be mounted to at least one conductor wall in the fixed and desired position in less than two (2) minutes or, more particularly, in less than one (1) minute. Likewise, the movable tray assembly 136 may be demounted from the conductor wall(s) in less than ten minutes, less than five minutes, less than three minutes, less than two minutes, or less than one minute.

Accordingly, the movable tray assembly 136 may be moved to different levels along the longitudinal axis 191. When the movable tray assembly 136 is moved toward the output shorting deck 155 or further from the output shorting deck 155, the output length 230 is effectively changed. The performance of a resonator is based, in part, on the dimensions of the inner and outer conductors and the output cavity. Changing the designated level of the grounding deck 146, effectively tunes the output cavity resonator 180. This procedure (e.g., moving the movable tray assembly 136 or the grounding deck 146 along the longitudinal axis 191) may be referred to as coarse tuning. As set forth herein, dimensions of the input cavity resonator 178 may already be fixed or set when the movable tray assembly 136 is moved along the longitudinal axis 191.

Figure 8:
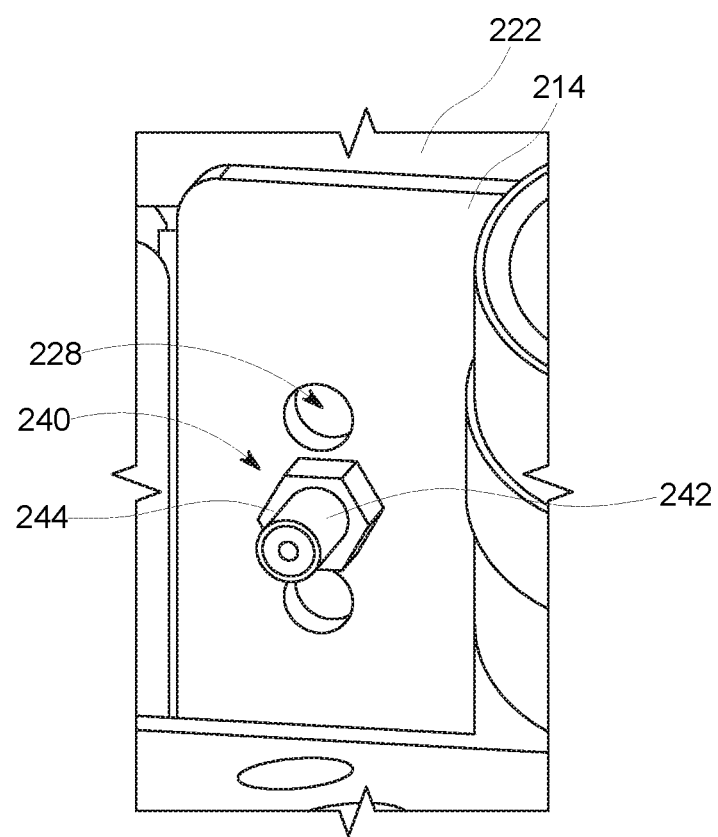
FIG. 8 is an enlarged view of a mechanism for mounting the movable tray assembly to at least one of the conductor walls.

FIG. 8 is an enlarged view of a portion of the securing panel 214 secured to the conductor wall 222 such that the movable tray assembly 136 (FIG. 7) is mounted to the conductor wall 222. FIG. 8 illustrates only one mechanical connection between the securing panel 214 and the conductor wall 222. More specifically, the hardware 240 includes a bolt 242 that extends through the middle mounting hole 228 of the column 220 and a nut 244 that is coupled to the bolt 242. The bolt 242 may extend from an exterior of the RF power generator 130, through the conductor wall 222, and through the middle mounting hole 228 of the securing panel 214. When the nut 244 is secured, the nut 244 and the bolt 242 may generate opposite compressive forces and effectively grip the ground wall 222 and the securing panel 214 therebetween. A similar mechanical connection (or connections) may be made elsewhere between the movable tray assembly 136 and the conductor wall 222. In particular embodiments, two such mechanical connections are formed. For example, one of the mounting holes 228 of the column 219 may receive corresponding hardware 240 and the same mounting hole 228 of the column 220 may receive corresponding hardware 240. However, alternative mechanisms may be used for coupling the securing panel 214 to the conductor wall 222. For example, the conductor wall 222 may include integrated elements that are sized and shaped to be received by the mounting holes 228.

FIG. 9 is a side cross-sectional view of the RF power generator 130 when fully assembled. As shown, the generator housing 132 includes a system door 200 and the movable access panel 252. The movable access panel 252 is positioned within the system cavity 134 and pressed against the conductive frame 190. As shown in FIG. 9, an outer space 344 exists between the inner and outer enclosures 150, 133. The outer space 344 may represent space outside of the inner enclosure 150. Collectively, the outer space 344 and the compartments 161-165 may form substantially the entire system cavity 134. (The compartment 165 (FIG. 3) is not shown in FIG. 9.)

Each of the compartments may include a corresponding access opening that opens to the outer space 344 when the movable access panel 252 is removed. For example, as shown in FIG. 9, the power cavity 161 has an access opening 311, the power compartment 162 has an access opening 312, and the port compartment 164 has an access opening 314. The movable access panel 252 is configured to engage the interior walls 151-158 and cover the access openings 311, 312, 314. Accordingly, the inner enclosure 150 and at least a portion of the outer enclosure 133 may define a shielded inner space of the system cavity 134. The inner enclosure 150 is configured to reduce electromagnetic radiation generated therein from leaking into the system cavity 134 or, more specifically, from leaking into the outer space 344. The inner enclosure 150 may also reduce electromagnetic radiation generated therein from leaking into the exterior.

The inner enclosure 150 and the outer enclosure 133 may be configured to provide multiple shielding structures that impede leakage of the electromagnetic radiation. For example, a substantial portion of the electromagnetic radiation is generated within the power cavity 161 and within the power compartment 163. In some embodiments, walls or surfaces that define the power cavity 161 and the power compartment 162 are devoid of openings that open directly to the exterior. For example, the external wall 145 may not have any seams, apertures, feedthroughs along the power cavity 161 and the power compartment 162 that extend through the external wall 145 and open directly to the exterior. Likewise, the external wall 142 (FIG. 3) may not have seams, apertures, feedthroughs along the power cavity 161 that extend through the external wall 142 and open directly to the exterior.

During operation of the RF power generator 130, the electric power generated within the power cavity 161 is transferred by the magnetic coupling loop 216 positioned within the power cavity 161 to an inner conductor 218 that is disposed within the port compartment 164. The inner conductor 218 is located within the inner enclosure 150 and may form a coaxial line 241 with an outer conductor 242 formed by the inner enclosure 150. The inner conductor 218 may have a relatively short length. For example, the length of the inner conductor 218 may be between 200 mm to 500 mm. In particular embodiments, the length of the inner conductor 218 is about 250 to 350 mm. The coaxial line 241 may transmit the electric power through the port compartment 164 to a passage 260 that opens to the exterior. The coaxial line 241 may engage a cable (not shown), such as the power cable 105 (FIG. 1), at the passage 260.

In certain embodiments, the coaxial line may form part of a directional coupler 225 that is configured to measure forward and reflected power along the coaxial line. The port compartment 164 may comprise the directional coupler 225. In certain embodiments, the coaxial line 241 may form part of a feedthrough assembly 245 that supplies the electric power to a power cable (not shown) located in the exterior of the RF power generator 130.

Figure 10:
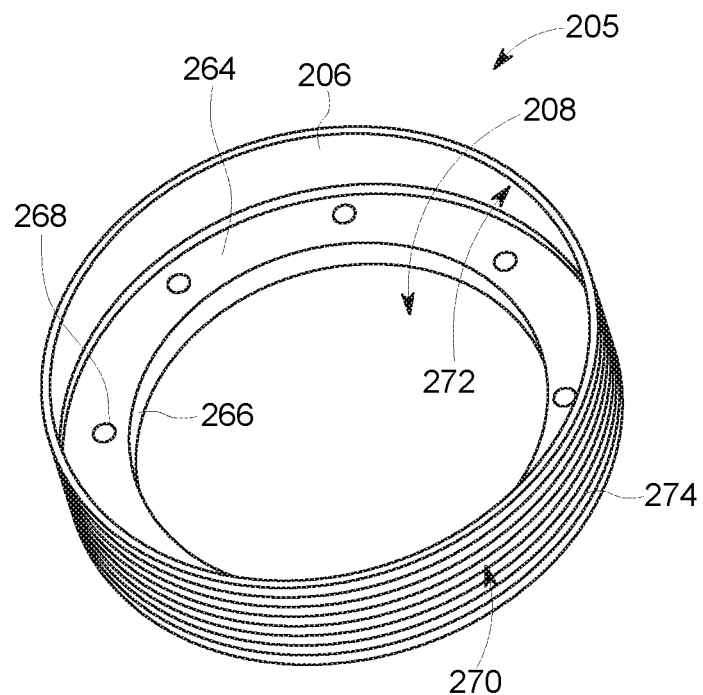
FIG. 10 is an isolated perspective view of an output connector that may be used with the tuning capacitor assembly of FIG. 5.

FIGS. 10-13 illustrate the tuning capacitor assembly 204 (FIG. 5) in greater detail. FIG. 10 is an isolated perspective view of the output connector 205. The output connector 205 is configured to be DC-isolated with respect to the output inner conductor 176 (FIG. 3). For example, an insulated foil (e.g., Kapton foil) may be wrapped around the power tube 172 and positioned between the power tube 172 and the output inner conductor 176. In the illustrated embodiment, the output connector 205 is mounted onto the anode electrode 209 (FIG. 5) of the power tube 172. In alternative embodiments, the output connector 205 may be mounted to an open end of the output inner conductor 176.

In the illustrated embodiment, the output connector 205 includes the connector wall 206 and a radial wall 264. The radial wall 264 is coupled to the connector wall 206 and extends radially-inward from the connector wall 206 toward the central axis 202 (FIG. 6). The radial wall 264 has an inner edge 266 that defines a size and shape of the thru-hole 208. The thru-hole 208 is configured to receive a portion of the power tube 172 (FIG. 3) therethrough. The radial wall 264 may also include openings 268 for receiving hardware (not shown) for securing the output connector 205 to the movable tray assembly 136. In particular embodiments, the output connector 205 is coupled directly to the power tube 172.

The connector wall 206 includes an outer side 270 that faces outward away from the central axis 202 and an inner side 272 that faces inward toward the central axis 202. The outer and inner sides 270, 272 face in opposite directions. Optionally, the connector wall 206 may include reference markers 274 that are visible features and/or morphological features along the connector wall 206. The reference markers 274 may be positioned along the outer side 270. By way of example, the reference markers 274 may be a series of annular grooves 276 (shown in FIG. 13). The grooves 276 are parallel to each other and surround the central axis 202. In alternative embodiments, the reference markers 274 may not be morphological features. Instead, the reference markers 274 may be a series of lines that are painted, drawn, or otherwise visible along the outer side 270.

Figure 11:
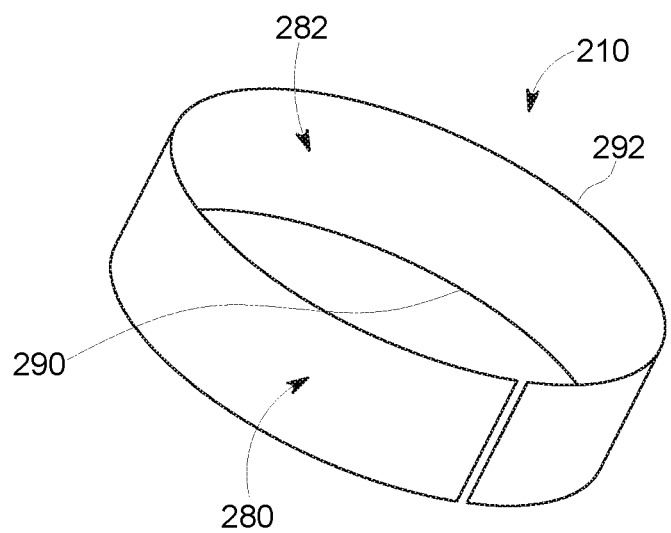
FIG. 11 is an isolated perspective view of a tuning sheet that may be used with the tuning capacitor assembly of FIG. 5.
Figure 12:
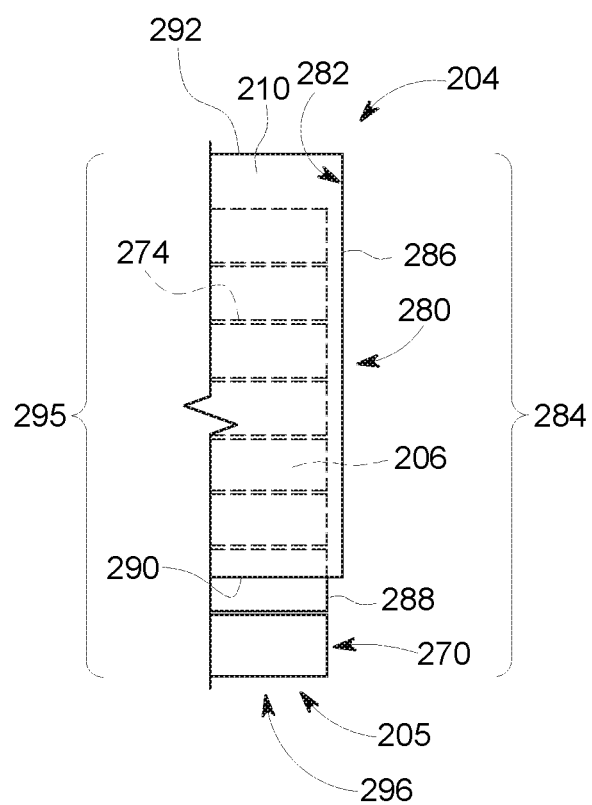
FIG. 12 is an enlarged side view of a portion of the tuning capacitor assembly showing the tuning sheet in a first axial position.

FIG. 11 is an isolated perspective view of the tuning sheet 210. The tuning sheet 210 may be a single piece of conductive sheet material (e.g., aluminum sheet metal) that is stamped and formed to have the shape shown in FIG. 11. The tuning sheet 210 is shaped as a band or ribbon that extends between a bottom edge 290 and a top edge 292. The tuning sheet 210 includes an outer side 280 that is configured to face outward away from the central axis 202, and an inner side 282 that is configured to face inward toward the central axis 202. As shown in FIGS. 11 and 12, the output connector 205 and the tuning sheet 210 are substantially annular or ring-shaped. It is contemplated, however, that the output connector 205 and/or the tuning sheet 210 may have other sizes and shapes in alternative embodiments.

Figure 13:
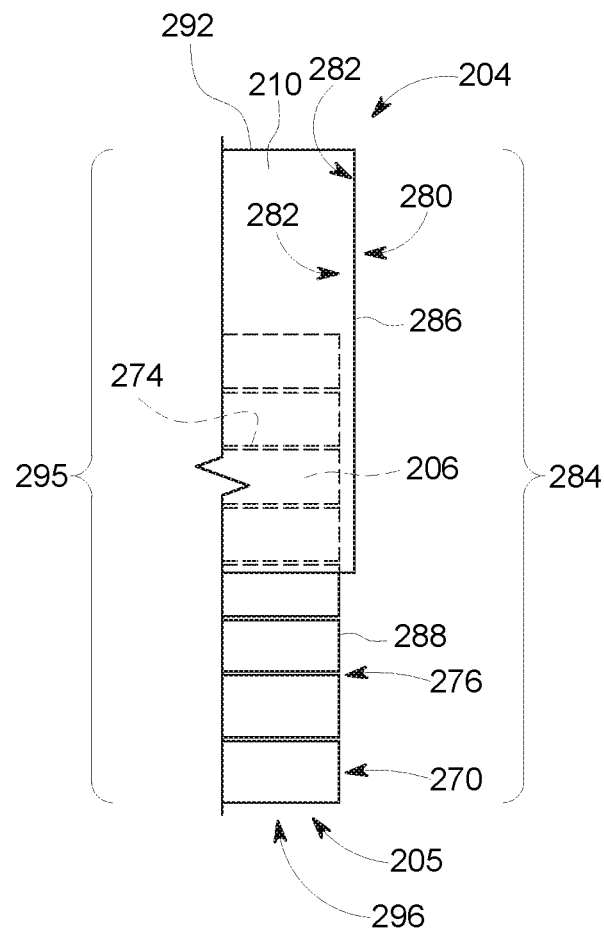
FIG. 13 is an enlarged side view of a portion of the tuning capacitor assembly showing the tuning sheet in a second axial position.

FIGS. 12 and 13 illustrate a portion of the tuning capacitor assembly 204 in which the tuning sheet 210 has different positions relative to the output connector 205 or, more specifically, the connector wall 206. In the illustrated embodiment, the tuning sheet 210 is wrapped about the connector wall 206 such that the inner side 282 of the tuning sheet 210 interfaces with the outer side 270 of the connector wall 206. In other embodiments, however, the tuning sheet 210 may be positioned within the output connector 205 such that the outer side 280 of the tuning sheet 210 interfaces with the inner side 272 (FIG. 10) of the connector wall 206.

In some embodiments, the tuning sheet 210 is movable with respect to the connector wall 206 between designated axial positions. Each axial position may correspond to a different height 295 of the tuning capacitor assembly 204 that is measured along the central axis 202 (FIG. 5) or the longitudinal axis 191 (FIG. 3). The height 295 may be measured between the top edge 292 of the tuning sheet 210 to a bottom 296 of the output connector 205. For example, the tuning sheet 210 has a first axial position in FIG. 12 and a second axial position in FIG. 13. As shown in FIGS. 12 and 13, the tuning sheet 210 and the output connector 205 may combine to form a combined capacitive surface 284. The combined capacitive surface 284 includes an exposed surface portion 286 from the tuning sheet 210 and an exposed surface portion 288 from the connector wall 206.

As the tuning sheet 210 is moved relative to the connector wall 206 along the central axis 202, the combined capacitive surface 284 changes. For example, as the tuning sheet 210 is moved from the first axial position in FIG. 12 to the second axial position in FIG. 13, the exposed surface portion 288 of the connector wall 206 increases and, consequently, the combined capacitive surface 284 increases in area. The increase in area corresponds to an increase in capacitance. As the tuning sheet 210 is moved from the second axial position in FIG. 13 to the first axial position in FIG. 12, the exposed surface portion 288 of the connector wall 206 decreases and, consequently, the combined capacitive surface 284 decreases in area, which corresponds to a decrease in capacitance. In other words, the capacitance of the tuning capacitor assembly 204 increases as the height 295 of the tuning capacitor assembly 204 increases, and the capacitance of the tuning capacitor assembly 204 decreases as the height 295 of the tuning capacitor assembly 204 decreases. Accordingly, the tuning sheet 210 may be moved relative to the connector wall 206 to change a capacitance of the output cavity resonator 180 (FIG. 9) and thereby fine tune the output cavity resonator 180. The tuning by moving the tuning sheet 210 may be characterized as fine tuning.

For embodiments that include the reference markers 274, the reference markers 274 may be used by the technician to estimate a position of the tuning sheet 210. For instance, the technician may wish to incrementally change the capacitance of the tuning capacitor assembly 204 by moving the tuning sheet 210 such that the bottom edge 290 of the tuning sheet 210 that is aligned with a first reference marker is moved to be aligned with an adjacent second reference marker. The distance between the adjacent first and second reference markers may be, for example, about two (2) mm, about four (4) mm, about six (6) mm, or about eight (8) mm. Accordingly, the reference markers 274 may indicate to the technician an amount of distance that the tuning sheet 210 has been moved. Each reference marker 274 may correspond to a different amount of capacitance.

The distance between adjacent reference markers may be the same throughout or, alternatively, may vary between different reference markers. In particular embodiments, the spacing may have a non-linear distribution in which each subsequent spacing is greater than (or less than) the previous spacing. For example, the reference markers may become closer together as the tuning sheet 210 moves from the top of the output connector 205 to the bottom 296. More specifically, a distance $X_1$ may be defined between a reference marker A, which is located at the bottom 296, and a reference marker B. A distance $X_2$ between the reference marker B and a reference marker C, which is located above the reference marker B, may be 60-95% of $X_1$. A distance $X_3$ between the reference marker C and a reference marker D, which is located above the reference marker C, may be 60-95% of the $X_2$. A total of five to fifteen reference markers may be positioned within this distribution. In some embodiments, the distances between the reference markers are configured to correlate with the same change in resonance frequency. Using the above as an example, the change in resonance frequency from reference marker A to reference marker B may be the same change in resonance frequency from the reference marker C to the reference marker D. Thus, in such embodiments, moving the tuning sheet 210 from any one reference marker to an adjacent reference marker will be the same change in resonance frequency.

Figure 14:
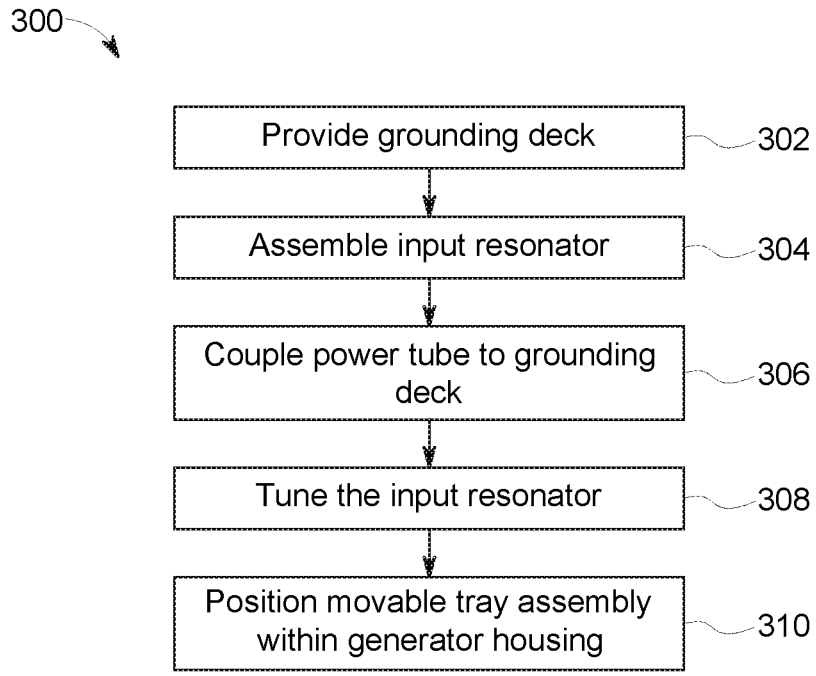
FIG. 14 is a flowchart illustrating a method formed in accordance with an embodiment.

FIG. 14 is a flow chart illustrating a method 300. The method 300, for example, may employ structures or aspects of various embodiments (e.g., systems and/or methods) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In some embodiments, the method 300 may be a method of assembling a movable tray assembly, such as the movable tray assembly 136 (FIG. 3), or a method of assembling a RF amplification system, such as the RF amplification system 170 (FIG. 3).

The method 300 includes providing, at 302, a grounding deck. The grounding deck may include a number of interconnected conductive elements, such as a base plate, sidewalls, and conductive elements. The base plate may have a central opening for receiving a power tube. The method may also include assembling, at 304, an input cavity resonator (or a partial input cavity resonator) and operationally coupling the input cavity resonator to the grounding deck to provide a movable tray assembly. The input cavity resonator may include, for example, an inner conductor, one or more capacitors, and an outer conductor. A partial input cavity resonator may include, for example, an inner conductor, one or more capacitors, and one or more ground walls that form part of the outer conductor. Optionally, the input cavity resonator may be assembled, at 304, after or during the assembly of double-disc capacitor, which is described in greater detail in U.S. Pat. No. 9,455,674, which is hereby incorporated by reference in its entirety.

In some embodiments, the providing, at 302 and the assembling, at 304, occur when the grounding deck, power tube, and input cavity resonator are located outside of a RF amplification system and/or a RF power generator. For example, the grounding deck may be mounted to a bench or other structure and the power tube and components of the input cavity resonator may be coupled to the grounding deck and operationally coupled to one another. In some embodiments, the movable tray assembly may be inverted when positioned on the bench. In such embodiments, the technician may have easier access to the components of the input cavity resonator.

The method 300 may also include coupling, at 306, a power tube to the grounding deck. For example, the assembly may be inverted (or flipped over) and the power tube may be coupled to the grounding deck. For example, the power tube may be inserted through an opening of the grounding deck from above the grounding deck such that a portion of the power tube advances into a cavity of the input inner conductor. The power tube may be secured to the base plate of the grounding deck. In this position, a portion of the power tube is located below the grounding deck within the input inner conductor and another portion of the power tube projects above the grounding deck. A tuning capacitor assembly, such as the tuning capacitor assembly 204, may be coupled to the power tube above the grounding deck. The method 300 may also include tuning, at 308, the input cavity resonator so that the input cavity resonator achieves a designated performance.

At 310, the movable tray assembly may be positioned within an interior space of a generator housing. The components of the movable tray assembly (e.g., the power tube, input cavity resonator, one or more capacitors, and the like) may move together as a unit when the movable tray assembly is positioned within the interior space. The positioning, at 310, may include removably mounting the movable tray assembly to a conductor wall of a generator housing. For example, the movable tray assembly may be secured to the conductor wall using tools and/or hardware.

The positioning, at 310, may also include selecting a level of the movable tray assembly from a plurality of possible levels. In some embodiments, the movable tray assembly and the conductor wall are configured relative to each other to provide only a designated number of levels (e.g., two, three, four, or more) for the movable tray assembly. In alternative embodiments, the movable tray assembly has a continuous range of possible levels. The positioning, at 310, may also be characterized as tuning a resonator.

Figure 15:
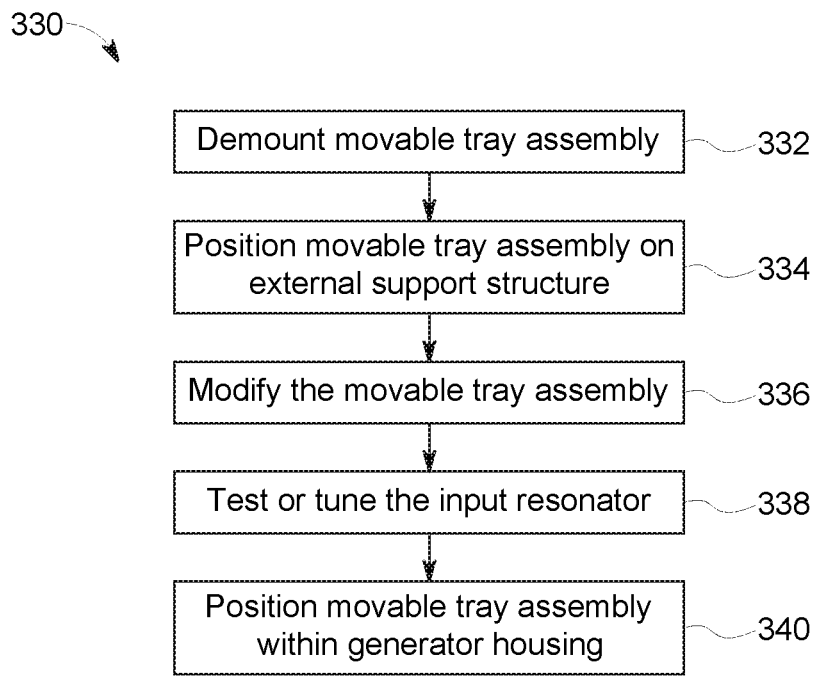
FIG. 15 is a flowchart illustrating a method formed in accordance with an embodiment.

FIG. 15 is a flow chart illustrating a method 330. The method 330, for example, may employ structures or aspects of various embodiments (e.g., systems and/or methods) discussed herein. In various embodiments, certain steps may be omitted or added, certain steps may be combined, certain steps may be performed simultaneously, certain steps may be performed concurrently, certain steps may be split into multiple steps, certain steps may be performed in a different order, or certain steps or series of steps may be re-performed in an iterative fashion. In some embodiments, the method 330 may be part of a maintenance procedure, such as replacing a power tube, servicing the input cavity resonator, testing the input cavity resonator, tuning the input cavity resonator, or tuning the output cavity resonator.

The method 330 includes demounting, at 332, a previously-assembled movable tray assembly with respect to a conductor wall of a generator housing. The method 330 also includes positioning, at 334, the movable tray assembly on an external support structure (e.g., bench) that is outside of the RF power generator. The movable tray assembly may include a grounding deck, a power tube, one or more capacitors, and an input cavity resonator. The positioning, at 334, may include inverting the movable tray assembly relative to the orientation of the movable tray assembly within the RF power generator. In the inverted position, the technician may have better access to the components of the input cavity resonator for replacing, repairing, or adjusting one or more of the components.

At 336, the technician may modify the movable tray assembly. For example, the modifying, at 336, may include replacing, repairing, or adjusting one or more of the components. In particular embodiments, the modifying 336 may include replacing the power tube. At 338, the input cavity resonator (or partial input cavity resonator) may be tested and/or tuned so that the input cavity resonator is sufficiently operational for a RF amplification system. At 340, the movable tray assembly may be positioned within the generator housing. As described herein, the positioning, at 340, may include selecting a level for the movable tray assembly to achieve a desired electrical performance.

Figure 16:
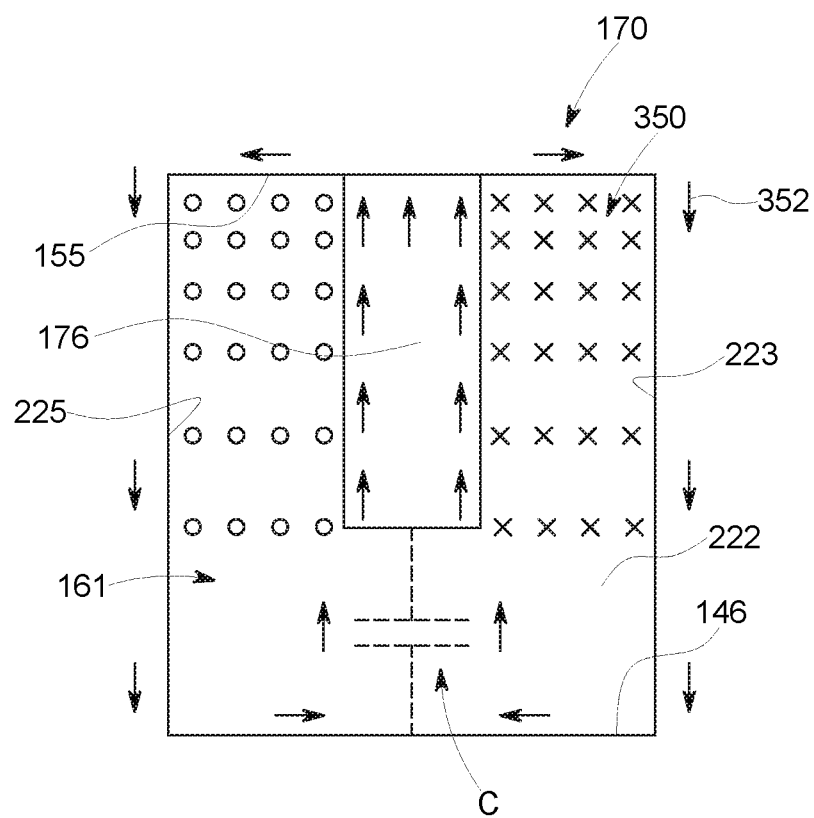
FIG. 16 illustrates the directions of magnetic fields and surface currents during operation of the RF amplification system of FIG. 3.

FIG. 16 is a schematic diagram illustrating magnetic field lines 350 and surface current arrows 352 at one point in time during operation of the output cavity resonator 180 of the RF amplification system 170. During operation of the RF amplification system 170 or the RF power generator 130, magnetic field lines are generated within the power cavity 161 and current flows along the inner surfaces of the conductor walls 221-223, the shorting deck 155, the access panel 252, and the grounding deck 146. For illustrative purposes, the surface current arrows 352 are positioned along the exterior, but it should be understood that the current propagates along the inner surfaces. It should also be understood that the directions of the arrows may be in opposite directions at another point in time.

The magnetic field travels around the output inner conductor 176 such that the magnetic field goes into the page (indicated by the x's) and out of the page (indicated by the dots). The magnetic field lines 350 form concentric circles around the output inner conductor 176 within the power cavity 161. As indicated by the density of the field lines, the magnetic field has a greater strength when the magnetic field is closer to the shorting deck 155 and closer to the output inner conductor 176. Also indicated in FIG. 16, the output cavity resonator 180 has a capacitance C that includes an inherent capacitance of the power tube 172 and additional capacitance from the tuning capacitor assembly 204.

The magnetic coupling loop 216 of the RF amplification system 170 is configured to transfer power from the power cavity 161 to an output transmission line (e.g., coaxial line), such as the power cable 105 (FIG. 1). The coupling loop 216 also transforms the load impedance of the RF amplification system 170 to an optimum load impedance at the anode 209 of the power tube 172.

The coupling loop 216 is designed to form a loop region through which the magnetic field lines extend. The coupling loop 216 (or a substantial portion thereof) extends along a plane. This plane is typically oriented perpendicular to the magnetic field to increase the amount of inductive coupling.

Figure 17:
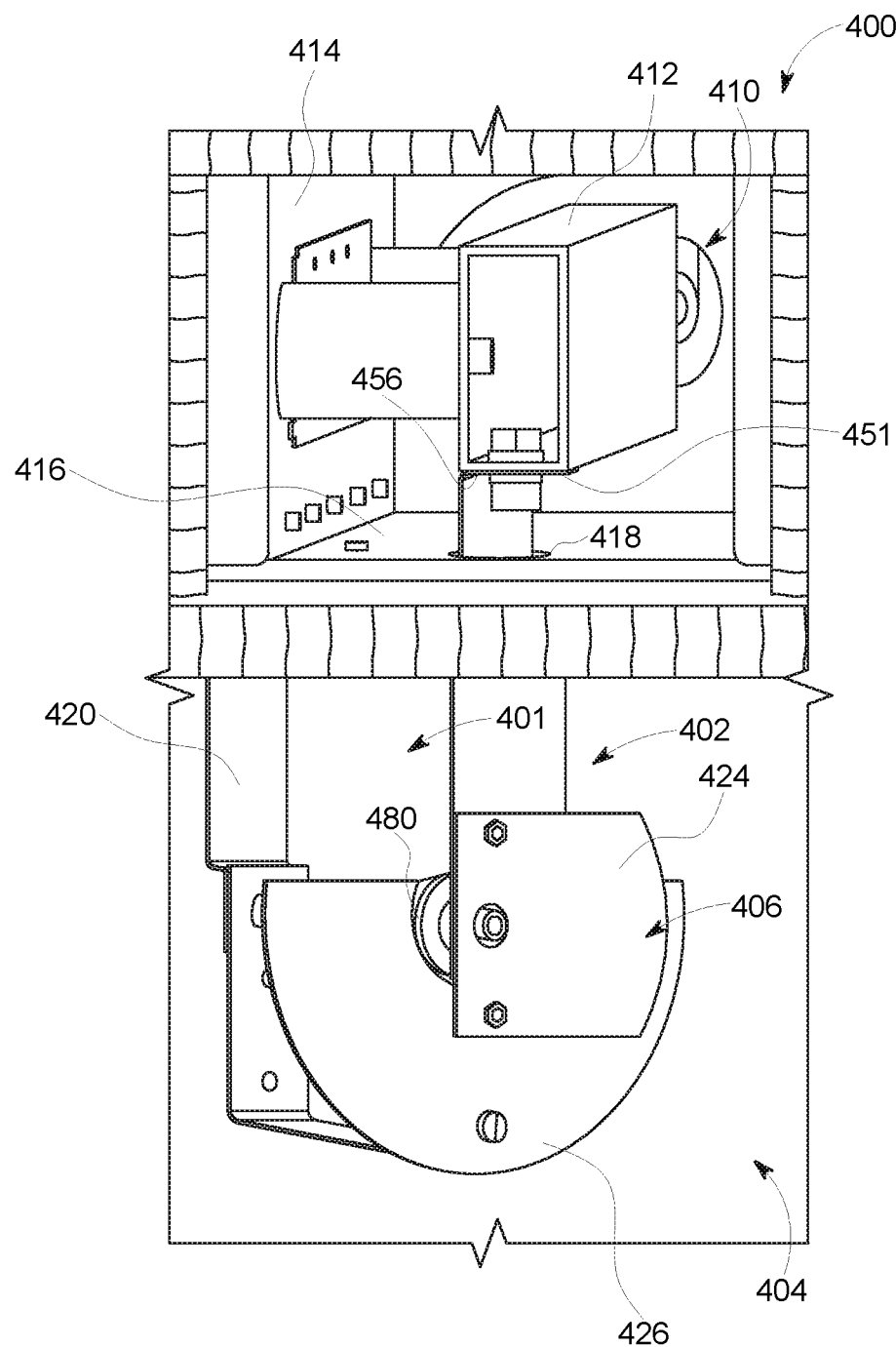
FIG. 17 is a perspective view of a coupling assembly disposed within a power cavity of the RF amplification system of FIG. 3 in accordance with an embodiment.
Figure 18:
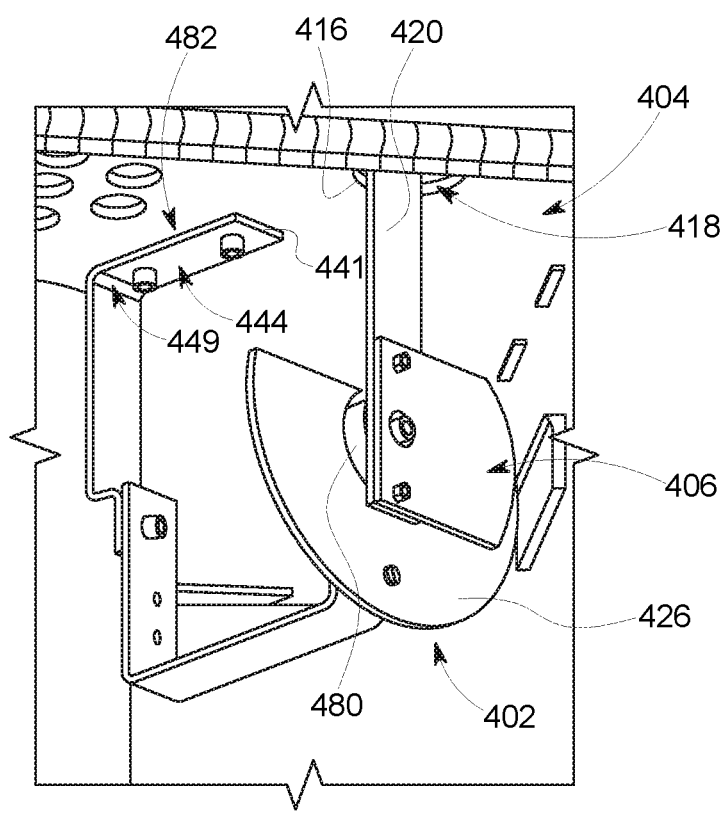
FIG. 18 is another perspective view of the coupling assembly disposed within a power cavity of the RF amplification system of FIG. 3 in accordance with an embodiment.

FIG. 17 is a perspective view of a portion of a RF power generator 400 that includes a coupling assembly 402 disposed within a power cavity 404 of a RF amplification system 401 (only a portion of the RF amplification system 401 is shown). FIG. 18 is an enlarged bottom perspective view of the coupling assembly 402 when installed at one operating position within the power cavity 404. The coupling assembly 402 has other operating positions as described below. The RF power generator 400, the RF amplification system 401, and the power cavity 404 may be similar or identical to the RF power generator 130 (FIG. 3), the RF amplification system 170 (FIG. 3), and the power cavity 161 (FIG. 3), respectively. For example, as shown in FIG. 17, the RF power generator 400 includes a coaxial line 410 that is formed by an inner conductor 412 and an outer conductor 414 of the RF power generator 400. The outer conductor 414 is formed, in part, by an interior wall 416 having a cavity passage 418 therethrough. As shown, the coupling assembly 402 has a coupling loop 420 in which a portion of the coupling loop 420 extends through the passage 418 to mechanically and electrically couple to the inner conductor 412.

The coupling loop 420 is configured to couple power generated within the power cavity 404 to an output transmission line (e.g., coaxial line). More specifically, the magnetic fields induce an electrical current within the coupling loop 420. An amount of power generated by the coupling loop 420 is a function of the amount of inductive coupling between the magnetic fields and the coupling loop 420. The coupling loop 420 is designed to form a loop region 422 (indicated in FIG. 19A) through which the magnetic field lines extend. The coupling loop 420 also transforms the load impedance of the RF amplification system 401 to an optimum load impedance at an anode (not shown) of the power tube (not shown).

In the illustrated embodiment, the coupling assembly 402 also includes a coupling-control instrument 406 that is at least partially attached to the coupling loop 420. In other embodiments, the coupling assembly 402 only includes the coupling loop 420 and does not include the coupling-control instrument 406. The coupling-control instrument 406 may indicate how to adjust the coupling loop 420 to increase or decrease an amount of inductive coupling. For example, the coupling-control instrument 406 includes an indicator 424 and at least one reference marker 426. As described herein, a position of the indicator 424 with respect to the at least one reference marker 426 may approximate the amount of inductive coupling and/or indicate how to adjust the coupling loop 420 to increase or decrease the amount of inductive coupling.

Figure 19A:
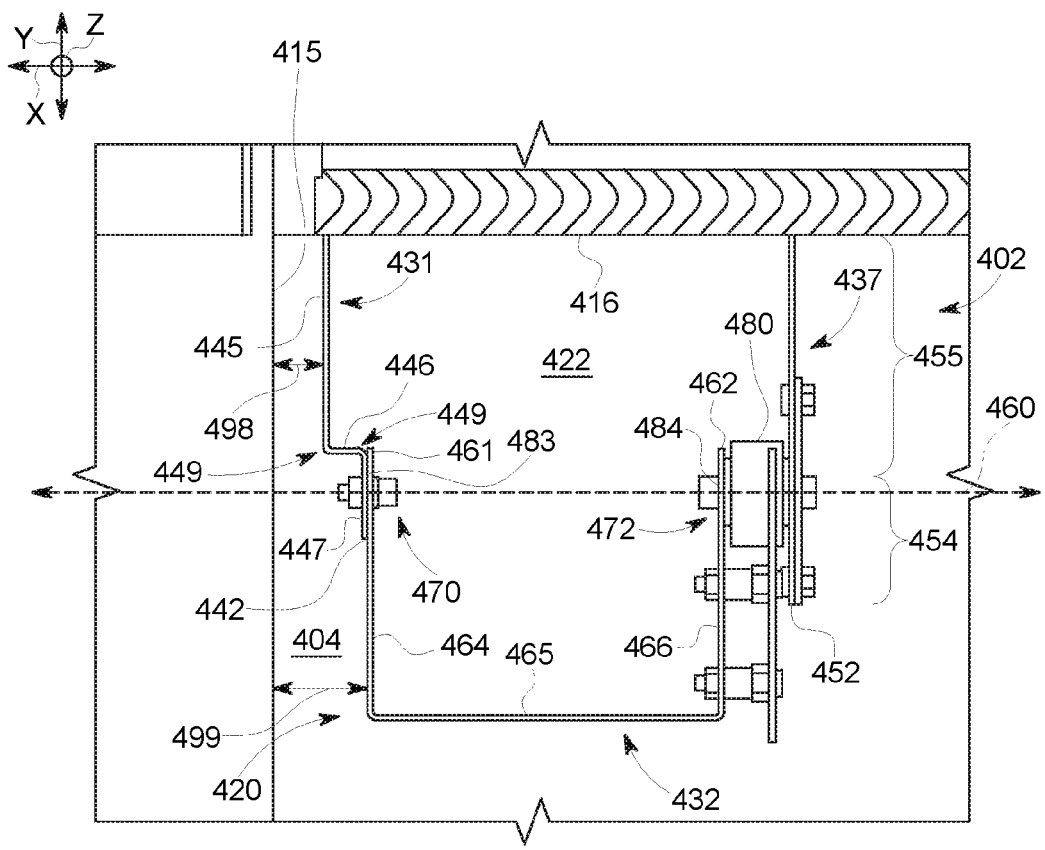
FIG. 19A is a side view of the coupling assembly disposed within a power cavity of the RF amplification system of FIG. 3 in accordance with an embodiment.

FIG. 19A is a side view of the coupling assembly 402. The coupling loop 420 includes a plurality of discrete segments that are mechanically and electrically coupled to one another to form the coupling loop 420. In the illustrated embodiment, the coupling loop 420 includes secured segments 431 and 433 and a movable segment 432. The secured segment 431 may be referred to as the first secured segment 431, and the secured segment 433 may be referred to as the second secured segment 433. The terms "first" and "second" do not, however, limit the coupling loop 420 to having only two secured segments. For example, in other embodiments, there may be additional secured segments. In other embodiments, there may be additional movable segments in the coupling loop 420.

The segments 431-433 are sized, shaped, and positioned relative to one another to define a designated loop region 422. The sizes, shapes, and positions of the segments may be selected to achieve a target performance. In FIG. 19A, the loop region 422 is substantially a block-shaped space with linear sides that is defined by the segments 431-433 and the interior wall 416, which may also be referred to as a grounding deck. In other words, the segments 431-433 and the interior wall 416 define boundaries of the loop region 422. The loop region 422 is a region that is oriented substantially perpendicular or transverse to the magnetic field within the power cavity 404. Schematically, the loop region 422 is oriented substantially perpendicular to magnetic field lines, such as the magnetic field lines 350 (FIG. 16). FIG. 19A shows mutually perpendicular X, Y, and Z axes. In some cases, the loop region 422 is a block-shaped space in which the segments 431-433 (as shown in FIG. 19A) and the interior wall 416 define two dimensions along the X and Y axes and a width of the segments 431-433 define a thickness of the loop region 422 along the Z axis. However, the loop region 422 may have a more complex geometry because the movable segment 432 may extend out of a XY plane that extends through the secured segments 431, 433.

The coupling loop 420 is designed to achieve a range of sizes for the loop region 422. The range of sizes correlate to a range of values of the amount of inductive coupling. In other words, the amount of inductive coupling is a function of the size of the loop region 422. The range of values may enable a technician to tune the RF power generator 400. For example, due to tolerances in manufacturing and the various systems and standards throughout the world, it can be challenging to develop a single RF power generator that can achieve the desired amount of inductive coupling for different installations. The movable segment 432 may enable the technician to tune the RF power generator 400 for operation.

Figure 19B:
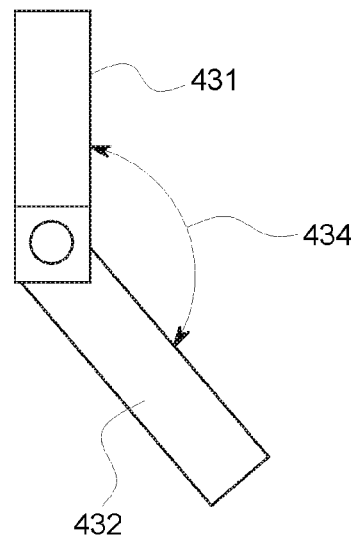
FIG. 19B is an isolated side view of the coupling assembly showing an angle formed between different components of the coupling assembly.

In FIG. 19A, the segments 431-433 are positioned such that the XY plane coincides with each of the segments 431-433. An angle 434 (shown in FIG. 19B) between the first secured segment 431 and the movable segment 432 is 180 degrees. Because the first and second secured segments 431, 433 are parallel to one another, the same angle 434 also exists between the second secured segment 433 and the movable segment 432. In other embodiments, however, the angle 434 is not required to be the same for each of the first and second secured segments 431, 433 with respect to the movable segment 432.

As described below, the movable segment 432 may be positioned at different operating positions such that the angle 434 (FIG. 19B) is between 0 degrees and 359 degrees. In the illustrated embodiment, a length of the electrical path of the coupling loop 420 does not change when the movable segment 432 has a different position. As such, the length of the electrical path is the same at any position of the movable segment 432. In alternative embodiments, however, the length of the electrical path may change based on a position of the movable segment.

The first secured segment 431 extends between segment ends 441 (shown in FIG. 18), 442. The first secured segment 431 includes a deck end portion 444 (shown in FIG. 18), a longitudinal portion 445, a fixed-coupling (or radial) portion 446, and a segment end portion 447. The portions 444-447 are defined between corresponding bends 449 in the first secured segment 431. The deck end portion 444 is secured directly to the interior wall 416 (or grounding deck 416). The deck end portion 444 extends parallel to the X axis. The longitudinal portion 445 extends essentially parallel to the Y axis and a surface of an inner conductor 415. The longitudinal portion 445 extends between and joins the deck end portion 444 and the fixed-coupling portion 446. The longitudinal portion 445 is spaced apart from the surface of the inner conductor 415 by a designated distance 498 along the X axis. In the illustrated embodiment, the distance 498 is essentially uniform along the length of the longitudinal portion 445, but is not required to be in other embodiments if the longitudinal portion 445 does not extend parallel to the inner conductor 415 or Y axis. The fixed-coupling portion 446 extends between and joins the longitudinal portion 445 and the segment end portion 447. As described herein, the fixed-coupling portion 446 may define a fixed section of the loop region 422 that determines a baseline portion of the amount of inductive coupling.

In the illustrated embodiment, the portions 444-447 are portions of the same piece of metal (e.g., copper bar or beam) that forms the first secured segment 431. In other embodiments, one or more of the portions 444-447 may be discrete sub-segments of the first secured segment 431 that are directly coupled (e.g., through hardware) to at least one other sub-segment. In FIG. 19A, each of the portions 444-447 is essentially linear between the bends 449. In other embodiments, one or more of the portions may have a curved shape. For example, the portions 445 and 446 may be combined and form a single portion that curves between the deck end portion 444 and the segment end portion 447. This single portion may also define the fixed section of the loop region 422.

The second secured segment 433 extends between segment ends 451 (FIG. 17), 452 and includes a segment end portion 454, a longitudinal portion 455, and a conductor end portion 456 (FIG. 17) that directly couples to the inner conductor 412 (FIG. 17). The segment end portion 454 is electrically coupled to the movable segment 432. The segment end portion 454 and the movable segment 432 are mechanically coupled such that the movable segment 432 is permitted to move and remain electrically coupled to the segment end portion 432. For example, the movable segment 432 is rotatably coupled to the first secured segment 431 through hardware 470. The longitudinal portion 455 extends essentially parallel to the Y axis. The longitudinal portion 455 extends between and joins the segment end portion 454 and the conductor end portion 456. As shown, the portions 454-456 of the second secured segment 433 are only portions of the same structure that forms the second secured segment 433. In other embodiments, one or more of the portions may be discrete sub-segments of the second secured segment 433.

The movable segment 432 extends between segment ends 461, 462 and includes a first longitudinal portion 464, a second longitudinal portion 466, and a radial portion 465 that extends between and joins the first and second longitudinal portions 464, 466. The first and second longitudinal portions 464, 466 extend essentially parallel to the Y axis. The first longitudinal portion 464 is spaced apart from the inner conductor 415 by a designated distance 499 along the X axis that is essentially uniform throughout when the movable segment 432 is positioned as shown. Due to the curvature of the inner conductor 415 the distance may change as the movable segment 432 is rotated. The radial portion 465 extends essentially parallel to the X axis. The movable segment 432 has a non-linear shape. The distances 498, 499 may be selected to achieve a target performance.

The movable segment 432 is configured to extend between and join the first and second secured segments 431, 433 thereby forming the coupling loop 420. The movable segment 432 is movable relative to each of the first and second secured segments 431, 433 while operably connected to the first and second secured segments 431, 433. For example, the first secured segment 431 is rotatably coupled to the movable segment 432 through hardware 470, and the second secured segment 433 is rotatably coupled to the movable segment 432 through hardware 472.

The hardware 470, 472 may include, for example, bolts, screws, nuts, washers, pins, hinges, and the like. The hardware 470, 472 is sufficiently conductive for its intended purpose and may make direct contact with the other conductive elements (e.g., the first secured segment 431 and the movable segment 432) to establish an electrical path therebetween.

In some embodiments, the hardware electrically couples the different elements. In other embodiments, the different elements may also be electrically coupled to one another directly. For example, the hardware 470 may electrically couple the first secured segment 431 and the movable segment 432, but the first secured segment 431 and the movable segment 432 may also be electrically coupled through direct contact at an interface 483. In the illustrated embodiment, the hardware 472 and a capacitor 480 may electrically couple the second secured segment 433 and the movable segment 432.

In the illustrated embodiment, the first and second secured segments 431, 433 are not movable with respect to each other and the interior wall 416 when the coupling loop 420 is operably formed or, in other words, ready for operation.

When the coupling loop 420 is operably formed, the first and second secured segments 431, 433 have fixed positions with respect to each other and the interior wall 416. More specifically, the first and second secured segments 431, 433 are only movable when disconnected from the RF power generator 400. When secured to the RF power generator 400 as shown, the first and second secured segments 431, 433 may not be movable. In alternative embodiments, the first and second secured segments 431, 433 may be movable with respect to the interior wall 416. For example, the first and second secured segments 431, 433 may be rotatably coupled through hardware.

In the illustrated embodiment, the movable segment 432 is rotatable about an axis of rotation 460. The axis of rotation 460 extends generally parallel to the interior wall 416 and the X axis, although it is contemplated that the axis of rotation 460 may have other orientations. In other embodiments, however, the movable segment may move relative to the first and second secured segments 431, 433 in other manners. For example, the radial portion 465 may be discrete with respect to the first and second longitudinal portions 464, 466 and may be configured to slide along the Y axis relative to the first and second longitudinal portions 464, 466. In such embodiments, a length of the electrical path of the coupling loop will change.

When the angle 434 (FIG. 19B) is greater than 0 degrees or less than 180 degrees or when the angle 434 is greater than 180 degrees and less than or equal to 359 degrees, the coupling loop 420 may have a three-dimensional structure. More specifically, the electrical path of the coupling loop 420 may extend at least partially along a Z axis that is perpendicular to the X and Y axes.

The coupling loop 420 is electrically connected to the grounding deck 416 at a conductor interface 482 (shown in FIG. 18). The first secured segment 431 and the movable segment 432 are electrically connected to each other at a conductor interface 483. The second secured segment 433 and the movable segment 432 are electrically connected to each other at a conductor interface 484. More specifically, the hardware 372, which is electrically connected to the second secured segment 433 through the capacitor 480) interfaces with the movable segment 432 at the conductor interface 484. The conductor interfaces 482-484 are conductive interfaces between discrete conductive elements. For example, the conductor interface 482 (FIG. 18) is the interface through which electrical current may flow between the grounding deck 416 and the first secured segment 431. The conductor interfaces 482-484 have fixed positions with respect to each other when the movable segment 432 is moved. The first secured segment 431 extends between the conductor interfaces 482 and 483. In the illustrated embodiment, the shape of the first secured segment 431 between the conductor interfaces 482, 483 is non-linear. More specifically, the portion of the first secured segment 431 that extends between the conductor interfaces 482, 483 is L-shaped between.

Figure 25:
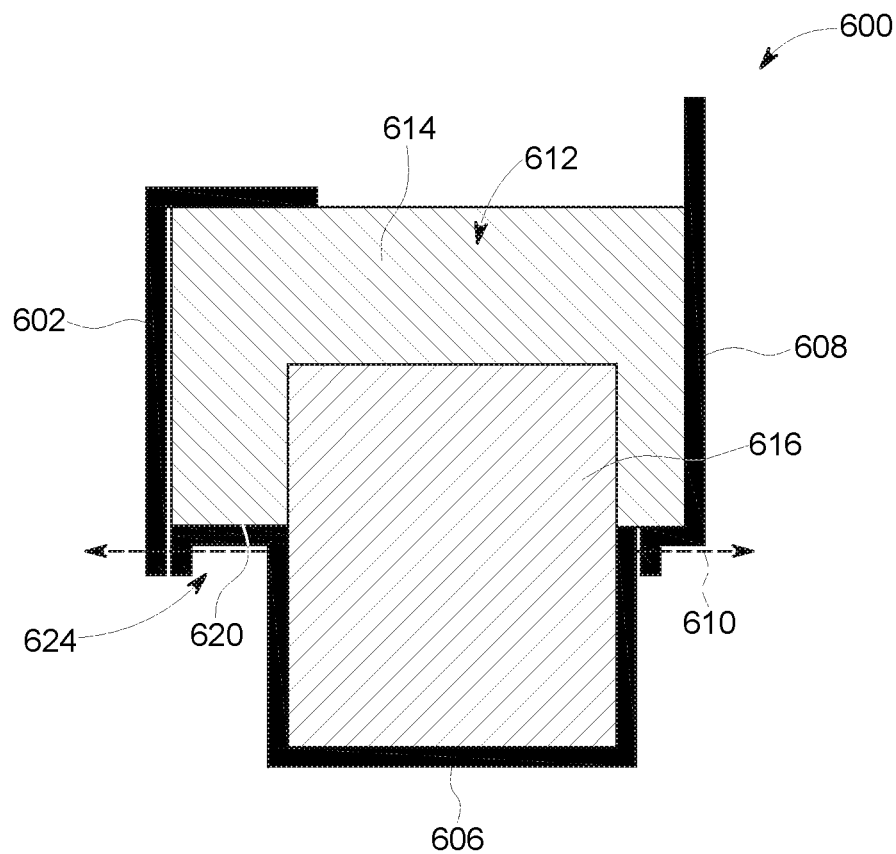
FIG. 25 is a side view of a coupling loop in accordance with an embodiment when a loop region has a maximum size.
Figure 26:
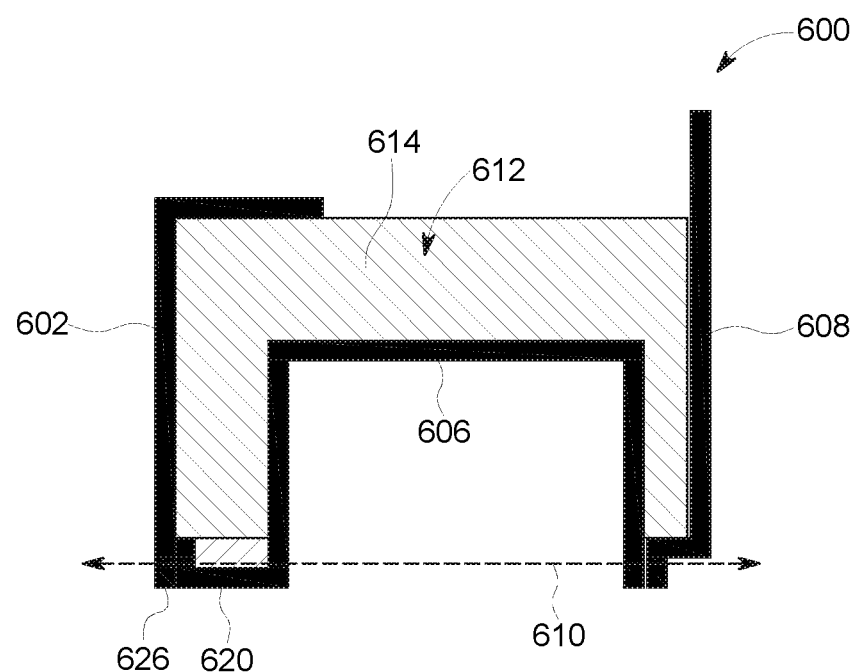
FIG. 26 is a side view of a coupling loop of FIG. 25 when a loop region has a minimum size.

In other embodiments, the portion of the first secured segment 431 extending between the conductor interfaces 482, 483 may have other non-linear shapes. Yet in other embodiments, the first secured segment 431 may be essentially linear as the first secured segment 431 extends between the conductor interfaces 482, 483. In such embodiments, the linear portion of the first secured segment 431 may be at a non-orthogonal angle with respect to the surface of the inner conductor 415 or the grounding deck 416 (or the Y axis or the X axis). Alternatively, the linear portion of the first secured segment 431 may be perpendicular to the grounding deck 416 and the X axis and parallel to the inner conductor 415 and the Y axis, but the movable segment 432 may have a leg (not shown) that extends parallel to the grounding deck 416 and perpendicular to the surface of the inner conductor 415. Such a leg is shown in FIGS. 25 and 26.

Figure 20:
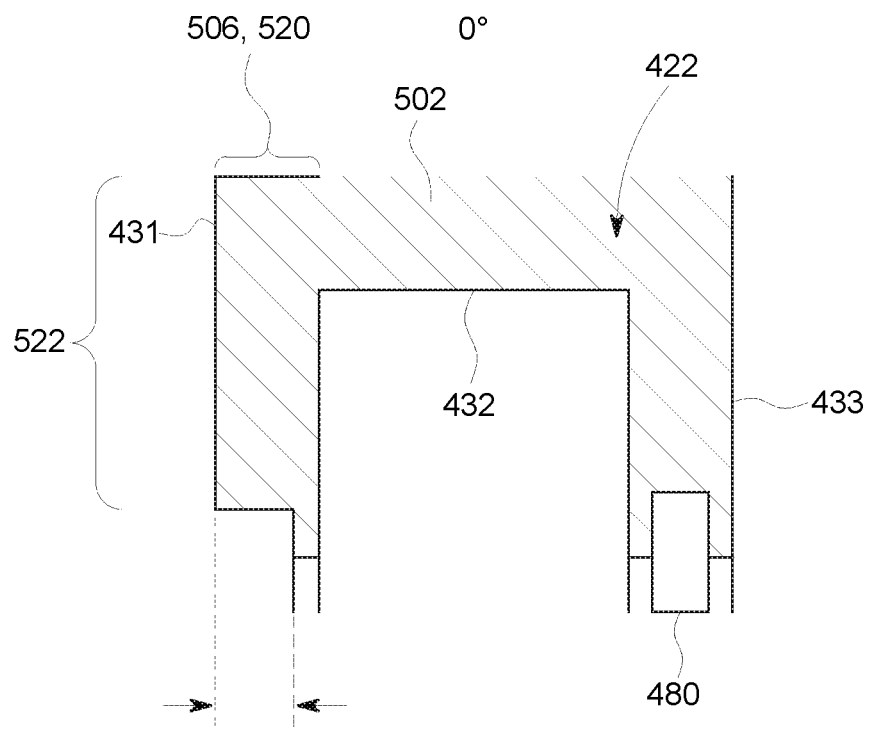
FIG. 20 is a schematic side view of a coupling loop of the coupling assembly when a movable segment of the coupling loop has a first position.
Figure 21:
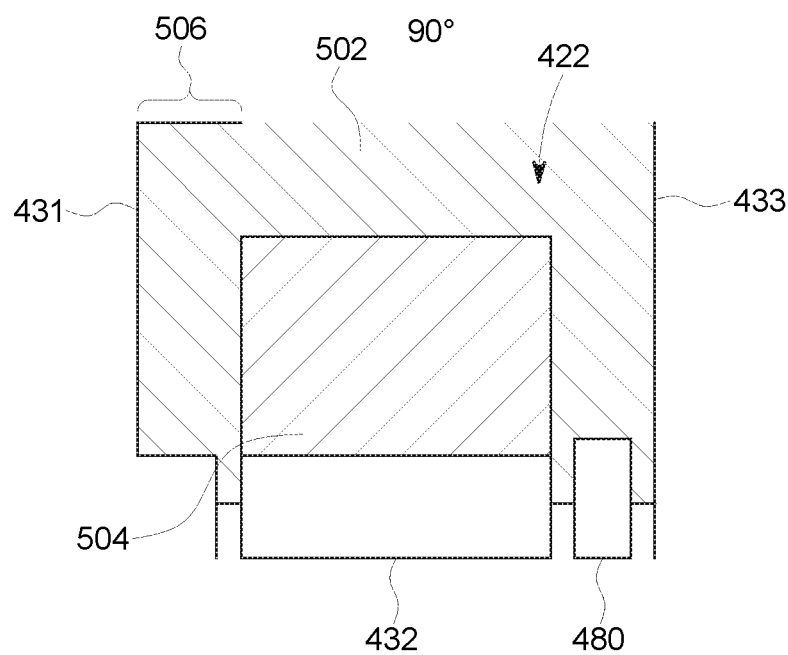
FIG. 21 is a schematic side view of the coupling loop when the movable segment of the coupling loop has a second position.
Figure 22:
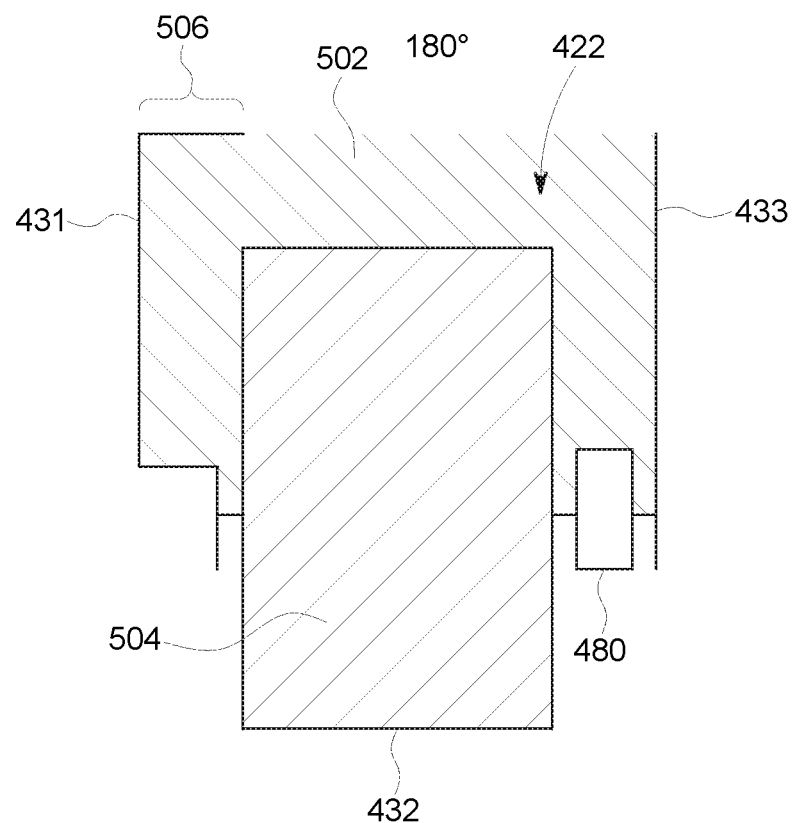
FIG. 22 is a schematic side view of the coupling loop when the movable segment of the coupling loop has a third position.

FIGS. 20-22 are schematic side views of the coupling loop 420 illustrating different orientations of the movable segment 432. More specifically, FIG. 20 shows the movable segment 432 at a designated position in which a size of the loop region 422 is minimized. FIG. 22 shows the movable segment 432 at a designated position in which a size of the loop region 422 is maximized, and FIG. 21 shows the movable segment 432 at a designated position in which a size of the loop region 422 is about halfway between the minimum size and the maximum size. More specifically, FIGS. 20-22 show the movable segment 432 at 0 degrees, 90 degrees, and 180 degrees, respectively, with respect to the first and second secured segments 431, 433.

The loop region 422 of the coupling loop 420 is designed to have a fixed section 502 and, in most instances, an adjustable section 504. The fixed section 502 is a portion of the loop region 422 that does not change in size. The fixed section 502 exists regardless of the position of the movable segment 432. In the illustrated embodiment, the fixed section 502 does not move and remains at the same position regardless of the position of the movable segment 432. The fixed section 502 is represented in FIGS. 20-22 by hatching that goes down as the lines extend left to right.

The adjustable section is a portion of the loop region 422 that may be selectively changed to control the amount of inductive coupling. The adjustable section 504 does not exist when the loop region 422 is at a minimum size, but exists when the loop region 422 has any other size. The adjustable section 504 is represented by hatching that goes up as the lines extend left to right. The movable segment 432 may be movable relative to the first secured segment 431 while the first secured segment is stationary. The movable segment 432 may be movable relative to the second secured segment 433 while the first secured segment is stationary. The movable segment 432 may be moved relative to the first secured segment to change a size of the adjustable section 504 and thereby change the amount of inductive coupling. The first secured segment 431 defines a boundary of the fixed section 502. The second secured segment 432, the interior wall 416, and the movable segment 432 define other boundaries of the fixed section 502.

The fixed section 502 of the loop region 422 determines a baseline portion of the amount of inductive coupling. The baseline portion of the amount of inductive coupling represents an amount of inductive coupling that will occur regardless of the orientation of the movable segment 432. The baseline portion may also represent the minimum amount of inductive coupling that will occur. Depending on the position of the movable segment 432, the adjustable section 504 may cause an additional amount of inductive coupling. For example, FIG. 22 shows a maximum size of the loop region 422.

The first secured segment 431 defines a boundary of an adjacent portion 506 of the fixed section 502. The adjacent portion 506 may be positioned between the first secured segment 431 and the movable segment 432, and/or the adjacent portion 506 may be positioned between the first secured segment 431 and a portion of the adjustable section 504. The magnetic field through the adjacent portion 506 may account for a substantial portion of the total amount of inductive coupling. For example, the adjacent portion 506 may account for at least 20% of the total amount of inductive coupling or, more specifically, at least 30% of the total amount of inductive coupling. In particular embodiments, the adjacent portion 506 may account for at least 40% of the total amount of inductive coupling or at least 50% of the total amount of inductive coupling. These percentages may be calculated through computer simulation. In some embodiments, the adjacent portion 506 of the loop region 422 is always oriented perpendicular or transverse to the magnetic fields regardless of the orientation of the movable segment 432.

The magnetic field through the fixed section 502 may also account for a substantial portion of the total amount of inductive coupling. For example, the baseline portion of the inductive coupling, which is a function of the fixed section 502, may account for at least 25% of a maximum amount of inductive coupling or, more specifically, at least 30% of the maximum amount of inductive coupling or, more specifically, at least 35% of the maximum amount of inductive coupling. In some cases, the baseline portion may account for at least 40% of the maximum amount of inductive coupling or, more specifically, at least 50% of the maximum amount of inductive coupling. In particular embodiments, the baseline portion may account for at least 60% of the maximum amount of inductive coupling or at least 70% of the maximum amount of inductive coupling or at least 80% of the maximum amount of inductive coupling. The adjustable section 504 may account for at most 70% of the maximum amount of inductive coupling, at most 60% of the maximum amount of inductive coupling or, more specifically, at most 50% of the maximum amount of inductive coupling. In particular embodiments, the adjustable section 504 may account for at most 40% of the maximum amount of inductive coupling or at most 30% of the total amount of inductive coupling or at most 20% of the maximum amount of inductive coupling.

The percentage of the maximum amount of inductive coupling may be calculated by comparing the amount of power provided when the loop region is at the minimum size to the amount of power provided when the loop region is at the maximum size. For example, with respect to the coupling loop 420, the loop region 422 is at the maximum size when the coupling loop 420 is at 180 degrees as shown in FIG. 22 and the minimum size when the coupling loop 420 is at 0 degrees as shown in FIG. 20. Dividing the power provided when the coupling loop 420 is at the minimum size with the power provided when the coupling loop 420 is at the maximum size will provide the percentage of the maximum amount of inductive coupling.

Because the magnetic field through the adjacent portion 506 may account for a substantial portion of the total amount of inductive coupling, the adjacent portion 506 may be designed to achieve at least a designated amount of inductive coupling. The adjacent portion 506 is defined by a first dimension 520 along the X axis and a second dimension 522 along the Y axis. In the illustrated embodiment, the first and second dimensions 520, 522 are essentially determined by the longitudinal portion 445 and the radial portion 446 of the first secured segment 431. However, various other dimensions may be used. Moreover, it is understood that the magnetic field is strongest closer toward the grounding deck. Controlling the size of the adjacent portion 506 in this region may have a greater effect on the inductive coupling.

Figure 23:
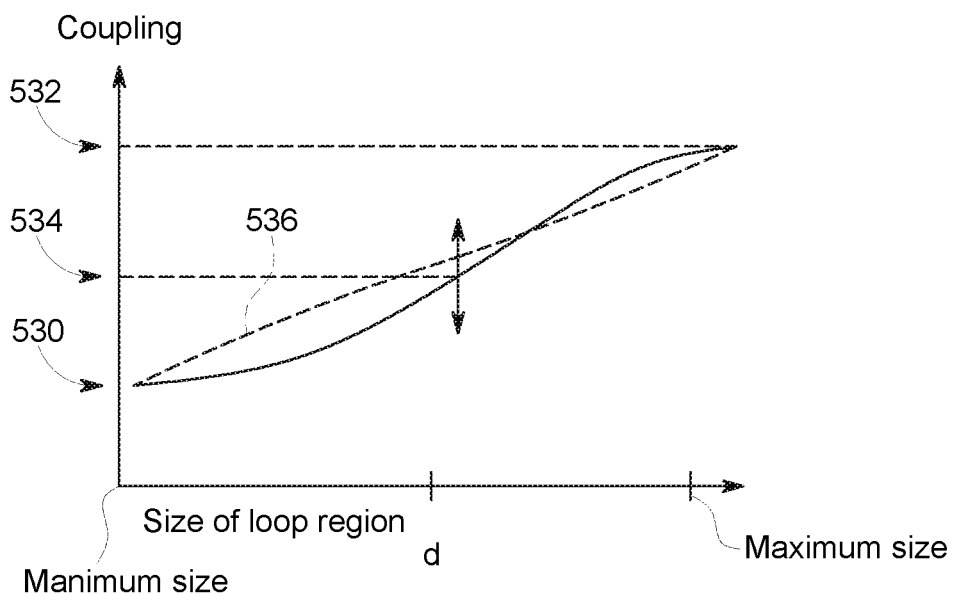
FIG. 23 illustrates a relationship between the position of the coupling loop and an amount of coupling.

FIG. 23 illustrates a relationship between a size of the loop region 422 and an amount of inductive coupling. When the loop region 422 is at the minimum size (shown in FIG. 20), the inductive coupling is at a designated minimum amount 530. When the loop region 422 is at the maximum size (shown in FIG. 22), the inductive coupling is at a designated maximum amount 532, which is the size of the fixed section and the maximum size of the adjustable section. When the loop region 422 is at the middle size (shown in FIG. 21), the inductive coupling is approximately halfway between the maximum and minimum values at a designated amount 534.

Accordingly, the movable segment 432 may be moved to different positions within the power cavity 404. This amount of inductive coupling caused by the magnetic field in the power cavity 404 can be adjusted to tune the RF power generator. The coupling loop 420 may form a mechanism for tuning the RF power generator that is less sensitive than other known mechanisms in which a position of the coupling loop is changed. For example, in some embodiments, the coupling loop 420 is designed so that the amount of inductive coupling changes in a substantially gradual manner. For example, a dashed line 536 between the minimum and maximum points in FIG. 23 has a slope X that represents an average rate of change in the inductive coupling between the minimum and maximum sizes of the loop region 422. In some embodiments, the coupling loop 420 is designed so that the solid line (the actual amount of inductive coupling) has a slope that is less than 2× or greater than 0 for any size of the loop region 422.

As used herein, the amount of inductive coupling "increases in a substantially gradual manner" if the rate at which the amount of inductive coupling changes from the baseline portion to a maximum of the amount of inductive coupling is greater than zero and does not exceed 2×. The amount of inductive coupling "decreases in a substantially gradual manner" if the rate at which the amount of inductive coupling changes from the maximum to the baseline portion is less than zero and is not less than −2×. The rate of change between the maximum and baseline portion may be calculated by determining the amount of power provided by the coupling loop when the loop region of the coupling loop is at a number of different sizes (e.g., at least ten different positions of the movable segment).

With respect to the coupling loop 420 shown in FIGS. 17-22, the movable segment 432 is capable of being rotated from 0 degrees to 359 degrees. The movable segment 432 may continue to be rotated even more in the same direction, but the operating positions of the movable segment 432 repeat. FIG. 23 only shows an amount of inductive coupling as the movable segment 432 is rotated from 0 degrees to 180 degrees. As the movable segment is rotated from 180 degrees to 359 degrees, the inductive coupling will decrease in a similar manner until the movable segment reaches 360 degrees (or 0 degrees). For example, the amount of inductive coupling at 225 degrees is essentially equal to the amount of inductive coupling at 135 degrees; the amount of inductive coupling at 270 degrees is essentially equal to the amount of inductive coupling at 90 degrees; the amount of inductive coupling at 315 degrees is essentially equal to the amount of inductive coupling at 45 degrees; and so forth.

As shown in FIGS. 17-22, the coupling assembly 402 may also include the capacitor 480. The capacitor 480 is in series with respect to the segments 431-433 of the coupling loop 420. In the illustrated embodiment, the capacitor 480 is disposed between the movable segment 432 and the second secured segment 433. In other embodiments, however, the capacitor 480 may be disposed between the movable segment 432 and the first secured segment 431. As another example, one of the secured segments may be split into sub-segments and the capacitor 480 may be positioned between these sub-segments. The capacitor 480 may compensate for the self-inductance in the coupling loop 420. The capacitor 480 is configured to overcome the voltage drop caused by the self-inductance. The capacitor 480 may resonate out the self-inductance of the coupling loop 420. The capacitor 480 may allow for a smaller loop region 422 to have an equal inductive coupling.

Figure 24:
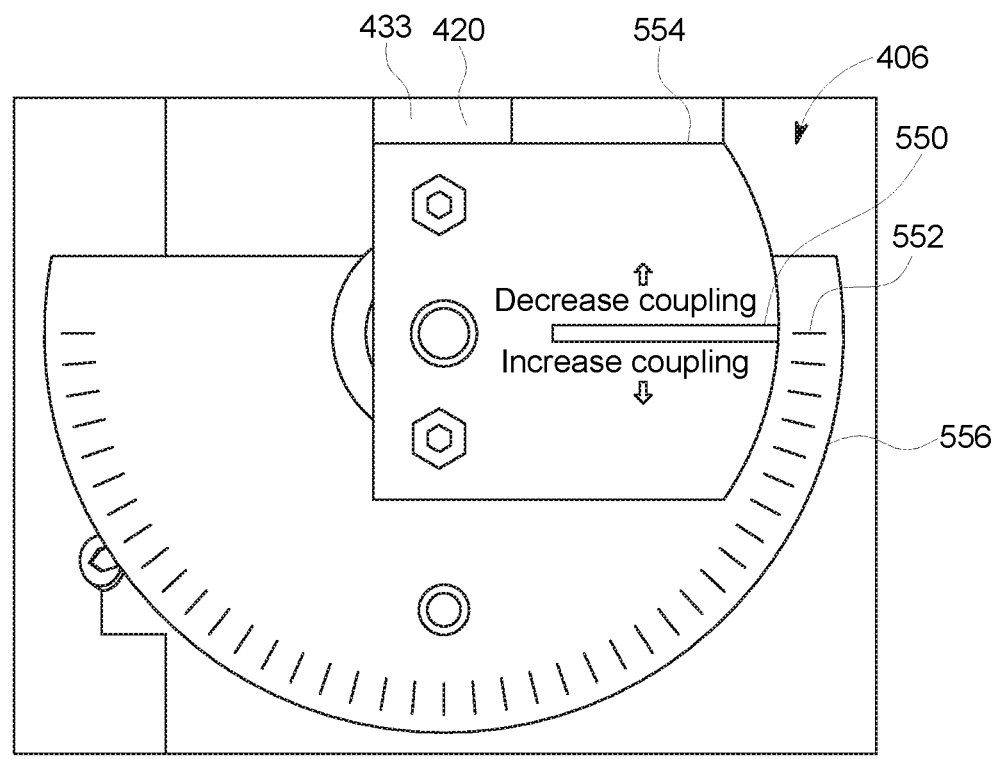
FIG. 24 is a front view of a label of the coupling assembly.

FIG. 24 is a front view of the coupling-control instrument 406. The coupling-control instrument 406 is attached to the coupling loop 420. In particular embodiments, the coupling control instrument 406 includes non-conductive components such that the non-conductive components do not disturb magnetic fields within the power cavity. The coupling-control instrument 406 may indicate how to move the movable segment 432 (FIG. 17) to increase or decrease the amount of inductive coupling in the power cavity 404. The coupling-control instrument 406 has an indicator 550 and at least one reference marker 552. In the illustrated embodiment, the indicator 550 and the reference marker 552 are provided onto panels 554, 556, respectively. The panels 554, 556 may be or include printed circuit boards. The panels 554, 556 may be devoid of conductive material.

The indicator 550 or the at least one reference marker 552 may be attached to the movable segment 432 (FIG. 17) and move with the movable segment 432 while the other has a stationary position. In the illustrated embodiment, the panel 556 is secured or affixed to the second longitudinal portion 466 of the movable segment 432 such that the panel 556 (and the at least one reference marker 552) move with the movable segment 432 when the movable segment 432 is rotated. The panel 554 is secured or affixed to the second secured segment 433 such that the panel 554 (and the indicator 550) has a stationary position. A position of the indicator 550 with respect to the at least one reference marker 552 may approximate the amount of inductive coupling. Also shown, the panel 554 may indicate a direction to move the movable segment 432 in order to adjust the inductive coupling. For example, the panel 554 has "Decrease coupling" and "Decrease I grid" to indicate how to rotate the movable segment 432. Optionally, the panel may replace "Decrease coupling" with "Decrease I anode" and replace "Increase coupling" with "Decrease I grid."

FIGS. 25 and 26 show side views of a coupling loop 600 in accordance with an embodiment. Although not shown, the coupling loop 600 may be part of a coupling assembly that includes a capacitor in series with the coupling loop 600. Similar to the coupling loop 420, the coupling loop 600 is configured to be positioned within a power cavity between an inner conductor and an outer conductor of a resonator (or RF amplification system). The coupling loop 600 includes a first secured segment 602 that is coupled to a grounding deck (not shown) and a movable segment 606 that is coupled to the first secured segment 602. The first secured segment 602 extends between the grounding deck and the movable segment 606. The coupling loop 600 also includes a second secured segment 608 that is coupled to an inner conductor (not shown) of a coaxial line.

The movable segment 606 is movable relative to the first secured segment 602 while the first secured segment 602 is stationary to change a size of a loop region 612 and thereby change an amount of inductive coupling between the coupling loop 600 and a magnetic field within the power cavity. As shown in FIGS. 25 and 26, the movable segment 606 is configured to be rotated about an axis of rotation 610. The loop region 612 includes a fixed section 614 and an adjustable section 616 (only shown in FIG. 25). The first secured segment 602 defines a boundary of the fixed section 614. At least a portion of the fixed section 614 of the loop region 612 exists between the adjustable section 616 and the first secured segment 602. The fixed section 614 determines a baseline portion of the amount of inductive coupling. The adjustable section 616 increases the amount of inductive coupling from the baseline portion.

Also shown in FIGS. 25 and 26, the movable segment 606 includes a leg 620 that is mechanically and electrically coupled to the first secured segment 602 through, for example, hardware (not shown). The leg 620 has a curved contour such that the leg 620 forms a recess 624 (FIG. 25). When the movable segment 606 is rotated to the position shown in FIG. 25, the recess 624 opens to an exterior of the coupling loop 600 and does not form a portion of the loop region 612. When the movable segment 606 is rotated to the position shown in FIG. 26, the recess 624 becomes a portion of the loop region 612. This recess 624 may form another adjustable section 626 of the loop region 612 and may be considered when designing the coupling loop 600 for any added inductive coupling that it may provide.

Figure 27:
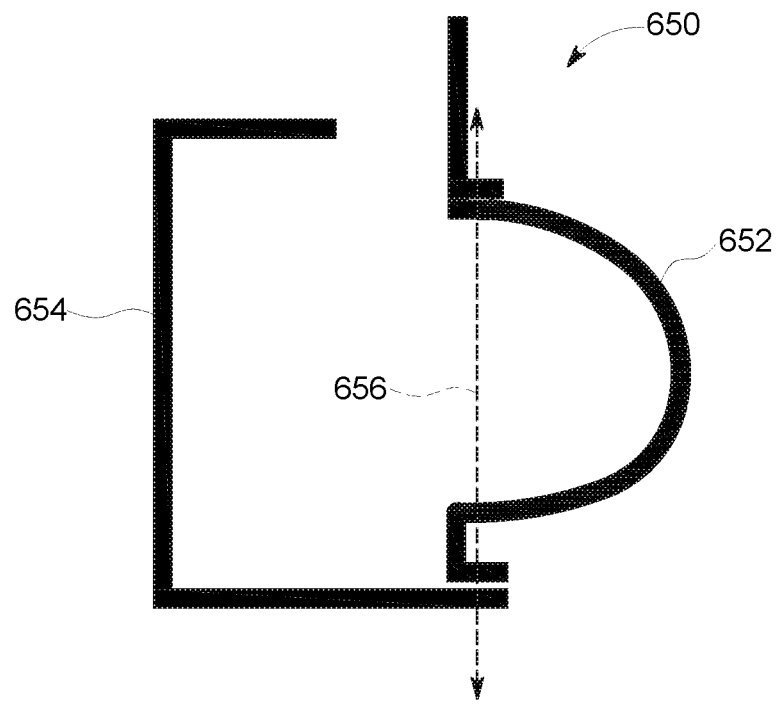
FIG. 27 is a side view of a coupling loop in accordance with an embodiment when a loop region has a maximum size.
Figure 28:
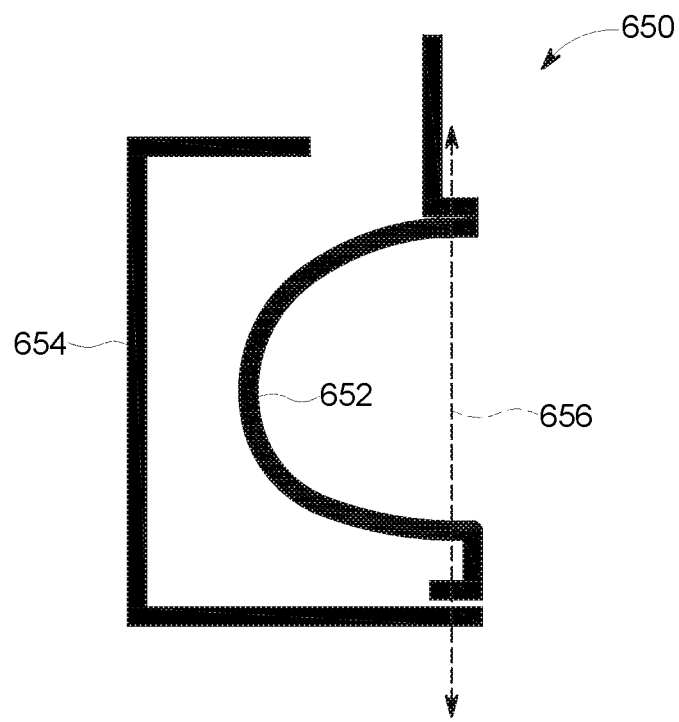
FIG. 28 is a side view of a coupling loop of FIG. 27 when a loop region has a minimum size.

FIGS. 27 and 28 show side views of a coupling loop 650 in accordance with an embodiment. Unlike the coupling loops 420 and 600, the coupling loop 650 has a movable segment 652 is configured to rotate about an axis of rotation 656 that is parallel to the Y axis or the inner conductor (not shown) of the resonator. The movable segment 652 has a curved contour or shape. Although not indicated, the coupling loop 650 has a loop region that includes a fixed section and an adjustable section. At least a portion of the fixed section is positioned between the adjustable section and a secured segment 654 that electrically couples the movable segment 652 to a grounding deck (not shown). In each of the embodiments of FIGS. 25-28, the fixed sections include adjacent portions, such as the adjacent portion 506, that may account for a substantial portion of the total amount of inductive coupling.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the inventive subject matter without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the inventive subject matter should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f) unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

The foregoing description of certain embodiments of the present inventive subject matter will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, or the like). Similarly, the programs may be stand alone programs, may be incorporated as subroutines in an operating system, may be functions in an installed software package, or the like. The various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "comprises," "including," "includes," "having," or "has" an element or a plurality of elements having a particular property may include additional such elements not having that property.

What is claimed is:

1. A radiofrequency (RF) amplification system comprising:
    a power cavity defined by a grounding deck, an inner conductor, and an outer conductor of the RF amplification system; and
    a coupling loop operably positioned within the power cavity between the inner conductor and the outer conductor, the coupling loop including a secured segment that is coupled to the grounding deck and a movable segment that is coupled to the secured segment, the secured segment extending between the grounding deck and the movable segment;
    wherein the coupling loop defines a loop region, the movable segment being movable relative to the secured segment while the secured segment is stationary to change a size of the loop region and thereby change an amount of inductive coupling between the coupling loop and a magnetic field within the power cavity.

2. The RF amplification system of claim 1, wherein the loop region includes a fixed section and an adjustable section, the secured segment defining a boundary of the fixed section, wherein at least a portion of the fixed section of the loop region exists between the adjustable section of the loop region and the secured segment, the fixed section of the loop region determining a baseline portion of the amount of inductive coupling, the adjustable section of the loop region increasing the amount of inductive coupling from the baseline portion.

3. The RF amplification system of claim 2, wherein the amount of inductive coupling increases in a substantially gradual manner as the amount of inductive coupling increases from the baseline portion to a maximum of the amount of inductive coupling.

4. The RF amplification system of claim 2, wherein the baseline portion is at least 30% of a maximum of the amount of inductive coupling.

5. The RF amplification system of claim 1, wherein the coupling loop is connected to the grounding deck at a first conductor interface and the secured segment and the movable segment are connected to each other at a second conductor interface, wherein the first and second conductor interfaces have fixed positions with respect to each other when the movable segment is moved, the secured segment extending between the first and second conductor interfaces and having a non-linear shape.

6. The RF amplification system of claim 1, wherein the secured segment is a first secured segment and the coupling loop further comprises a second secured segment that is electrically coupled to an output conductor of the RF amplification system, the movable segment extending between and electrically joining the first and second secured segments, the movable segment being movable relative to the first and second secured segments.

7. The RF amplification system of claim 1, further comprising a capacitor positioned in series with the secured segment and the movable segment.

8. The RF amplification system of claim 1, wherein the movable segment is rotatable about an axis of rotation that extends generally parallel to the grounding deck, the coupling loop having a three-dimensional structure at one or more positions of the movable segment.

9. The RF amplification system of claim 1, further comprising a coupling-control instrument that is attached to the coupling loop, the coupling-control instrument indicating how to move the movable segment to increase or decrease the amount of inductive coupling.

10. The RF amplification system of claim 9, wherein the coupling-control instrument includes non-conductive material and has an indicator and at least one reference marker, wherein a position of the indicator with respect to the at least one reference marker approximates the amount of inductive coupling, wherein the indicator or the at least one reference marker is attached to the movable segment and moves with the movable segment while the other has a stationary position.

11. A coupling assembly configured to transfer power to a load, the coupling assembly comprising:
    a first secured segment configured to mechanically and electrically couple to a ground;
    a second secured segment configured to mechanically and electrically couple to an output conductor; and
    a movable segment configured to extend between and join the first and second secured segments thereby forming a coupling loop, the movable segment being movable relative to each of the first and second secured segments while connected to the first and second secured segments;
    wherein the coupling loop is configured to define a loop region, the movable segment being movable relative to the first and second secured segments to change a size of the loop region and thereby change an amount of inductive coupling between the coupling loop and a magnetic field.

12. The coupling assembly of claim 11, wherein the loop region includes a fixed section and an adjustable section, the first secured segment defining a boundary of the fixed section, the movable segment being movable relative to the first and second secured segments to change a size of the adjustable section of the loop region and thereby change the amount of inductive coupling, wherein at least a portion of the fixed section of the loop region exists between the adjustable section of the loop region and the first secured segment, the fixed section of the loop region determining a baseline portion of the amount of inductive coupling, the adjustable section of the loop region increasing the amount of inductive coupling from the baseline portion.

13. The coupling assembly of claim 11, further comprising a capacitor positioned in series with the movable segment and the first and second secured segments.

14. The coupling assembly of claim 11, wherein the first secured segment is designed to be positioned in a region with a stronger magnetic field than a region where the second secured segment is positioned.

15. The coupling assembly of claim 11, further comprising a coupling-control instrument that is attached to the coupling loop, the coupling-control instrument indicating how to move the movable segment to increase or decrease the amount of inductive coupling.

16. The coupling assembly of claim 15, wherein the coupling-control instrument includes non-conductive material and has an indicator and at least one reference marker, wherein a position of the indicator with respect to the at least one reference marker approximates the amount of inductive coupling, wherein the indicator or the at least one reference marker is attached to the movable segment and moves with the movable segment while the other has a stationary position.

17. A method of tuning a radio-frequency (RF) amplification system, the method comprising:
providing a resonator that includes an inner conductor and an outer conductor that define a power cavity therebetween, wherein a coupling loop is positioned within the power cavity between the inner conductor and the outer conductor, the coupling loop including a secured segment that is electrically coupled to a grounding deck and a movable segment that is mechanically and electrically coupled to the secured segment, the secured segment extending between the grounding deck and the movable segment; and
moving the movable segment of the coupling loop relative to the secured segment while the secured segment is stationary to change a size of a loop region of the coupling loop.

18. The method of claim 17, wherein the secured segment is a first secured segment and the coupling loop further comprises a second secured segment that is electrically coupled to an output, the movable segment extending between and electrically joining the first and second secured segments, the movable segment being movable relative to the first and second secured segments.

19. The method of claim 18, wherein the coupling loop includes a capacitor positioned in series with the movable segment and the second secured segment.

20. The method of claim 17, wherein the resonator includes a coupling-control instrument that is attached to the coupling loop, the coupling-control instrument indicating how to move the movable segment to increase or decrease the amount of inductive coupling.

* * * * *